US008071995B2

(12) United States Patent
Sato et al.

(10) Patent No.: US 8,071,995 B2
(45) Date of Patent: Dec. 6, 2011

(54) LIGHT EMITTING DEVICE AND A METHOD FOR MANUFACTURING THE SAME

(75) Inventors: Takahiro Sato, Kanagawa-ken (JP); Iwao Mitsuishi, Tokyo (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 115 days.

(21) Appl. No.: 12/719,484

(22) Filed: Mar. 8, 2010

(65) Prior Publication Data
US 2011/0019707 A1 Jan. 27, 2011

Related U.S. Application Data

(63) Continuation of application No. PCT/JP2009/063354, filed on Jul. 27, 2009.

(51) Int. Cl.
*H01L 33/00* (2010.01)
(52) U.S. Cl. .................................. 257/98; 257/E33.056
(58) Field of Classification Search ............ 257/98–100, 257/432, E33.056
See application file for complete search history.

(56) References Cited

U.S. PATENT DOCUMENTS

| 2004/0036081 | A1* | 2/2004 | Okazaki | 257/99 |
| 2005/0184298 | A1* | 8/2005 | Ueda | 257/79 |
| 2005/0253158 | A1* | 11/2005 | Yasukawa et al. | 257/98 |
| 2007/0210326 | A1* | 9/2007 | Kurihara | 257/98 |
| 2007/0215890 | A1 | 9/2007 | Harbers et al. | |
| 2008/0111145 | A1* | 5/2008 | Lin | 257/98 |
| 2008/0149962 | A1* | 6/2008 | Kim et al. | 257/99 |
| 2008/0210957 | A1* | 9/2008 | Watanabe et al. | 257/89 |
| 2008/0231162 | A1 | 9/2008 | Kurihara et al. | |
| 2009/0058256 | A1 | 3/2009 | Mitsuishi et al. | |
| 2010/0051988 | A1 | 3/2010 | Mitsuishi et al. | |
| 2010/0237375 | A1* | 9/2010 | Yamazaki et al. | 257/98 |
| 2010/0301357 | A1* | 12/2010 | Chen et al. | 257/98 |
| 2011/0156082 | A1* | 6/2011 | Yu et al. | 257/99 |
| 2011/0193123 | A1* | 8/2011 | Moon et al. | 257/98 |

FOREIGN PATENT DOCUMENTS

| JP | 2004-179601 | 6/2004 |
| JP | 2005-276883 | 10/2005 |
| JP | 2006-179684 | 7/2006 |
| JP | 2007-35885 | 2/2007 |
| JP | 2007-80872 | 3/2007 |
| JP | 2008-294378 | 12/2008 |
| JP | 2009-71254 | 4/2009 |

* cited by examiner

*Primary Examiner* — Nathan Ha
(74) *Attorney, Agent, or Firm* — Oblon, Spivak, McClelland, Maier & Neustadt, L.L.P.

(57) ABSTRACT

A light emitting device, includes: a light source to emit source light; a first wavelength conversion portion to absorb the source light and to emit first light having a wavelength different from a wavelength of the source light; a light transmitting portion provided at an opposite side of the first wavelength conversion portion from the light source and configured to transmit the source light and the first light; and a second wavelength conversion portion provided at an opposite side of the light transmitting portion from the first wavelength conversion portion and configured to absorb at least one of the source light and the first light to emit second light having a wavelength different from the wavelength of the source light and also different from a wavelength of the first light. Part of the source light is configured to be taken to an outside of the light emitting device without passing through at least one of the first wavelength conversion portion and the second wavelength conversion portion.

20 Claims, 18 Drawing Sheets

LIGHT EMITTING DEVICE AND A METHOD FOR MANUFACTURING THE SAME

CROSS-REFERENCE TO RELATED APPLICATIONS

This is a continuation application of International Application PCT/JP2009/063354, filed on Jul. 27, 2009; the entire contents of which are incorporated herein by reference.

BACKGROUND OF THE INVENTION

This invention relates to a light emitting device and a method for manufacturing the same.

Attention has been focused on white-light emitting devices with high efficiency and high luminous flux, which use light emitting elements such as LEDs (Light Emitting Diodes). In such a light emitting device, for example, violet to blue light rays emitted from LEDs are wavelength-converted by fluorescent materials to generate light of other colors and thus obtain white light.

A technique has been disclosed in which a green fluorescent material layer is stacked with a red fluorescent material layer in such a light emitting device to improve the color rendering index (for example, refer to JP-A 2007-80872 (Kokai)). However, even with this technique, improvement in luminous efficiency is not enough, and accordingly further improvement can be expected.

SUMMARY OF THE INVENTION

According to an aspect of the invention, there is provided a light emitting device, including: a light source to emit source light; a first wavelength conversion portion to absorb the source light and to emit first light having a wavelength different from a wavelength of the source light; a light transmitting portion provided at an opposite side of the first wavelength conversion portion from the light source and configured to transmit the source light and the first light; and a second wavelength conversion portion provided at an opposite side of the light transmitting portion from the first wavelength conversion portion and configured to absorb at least one of the source light and the first light to emit second light having a wavelength different from the wavelength of the source light and also different from a wavelength of the first light, part of the source light being configured to be taken to an outside of the light emitting device without passing through at least one of the first wavelength conversion portion and the second wavelength conversion portion.

According to another aspect of the invention, there is provided a method for manufacturing a light emitting device, the light emitting device including: a light source to emit source light; a first wavelength conversion portion to absorb the source light and to emit first light having a wavelength different from a wavelength of the source light; a light transmitting portion provided at an opposite side of the first wavelength conversion portion from the light source and configured to transmit the source light and the first light; and a second wavelength conversion portion provided at an opposite side of the light transmitting portion from the first wavelength conversion portion and configured to absorb at least one of the source light and the first light to emit second light having a wavelength different from the wavelength of the source light and also different from a wavelength of the first light, part of the source light being configured to be taken to an outside of the light emitting device without passing through at least one of the first wavelength conversion portion and the second wavelength conversion portion, the method including: forming the first wavelength conversion portion; forming the light transmitting portion, and forming the second wavelength conversion portion, at least one of the forming the first wavelength conversion portion and the forming the second wavelength conversion portion includes making a hole in at least one of the first wavelength conversion portion and the second wavelength conversion portion.

DETAILED DESCRIPTION

Hereinafter, embodiments of the invention will be described in detail with reference to the drawings.

It should be noted that the drawings are schematic or conceptual. The relationship between the thickness and width of each portion, the dimensional ratios between different portions, and the like are not necessarily equal to actual ones. Further, the same portion may be represented using different dimensions and ratios in different drawings.

It should be noted that, in the description and drawings of this application, the same components as those already described, if any, in relation to an already mentioned drawing are denoted by the same reference signs, and detailed descriptions thereof will be appropriately omitted.

First Embodiment

Figure 1:
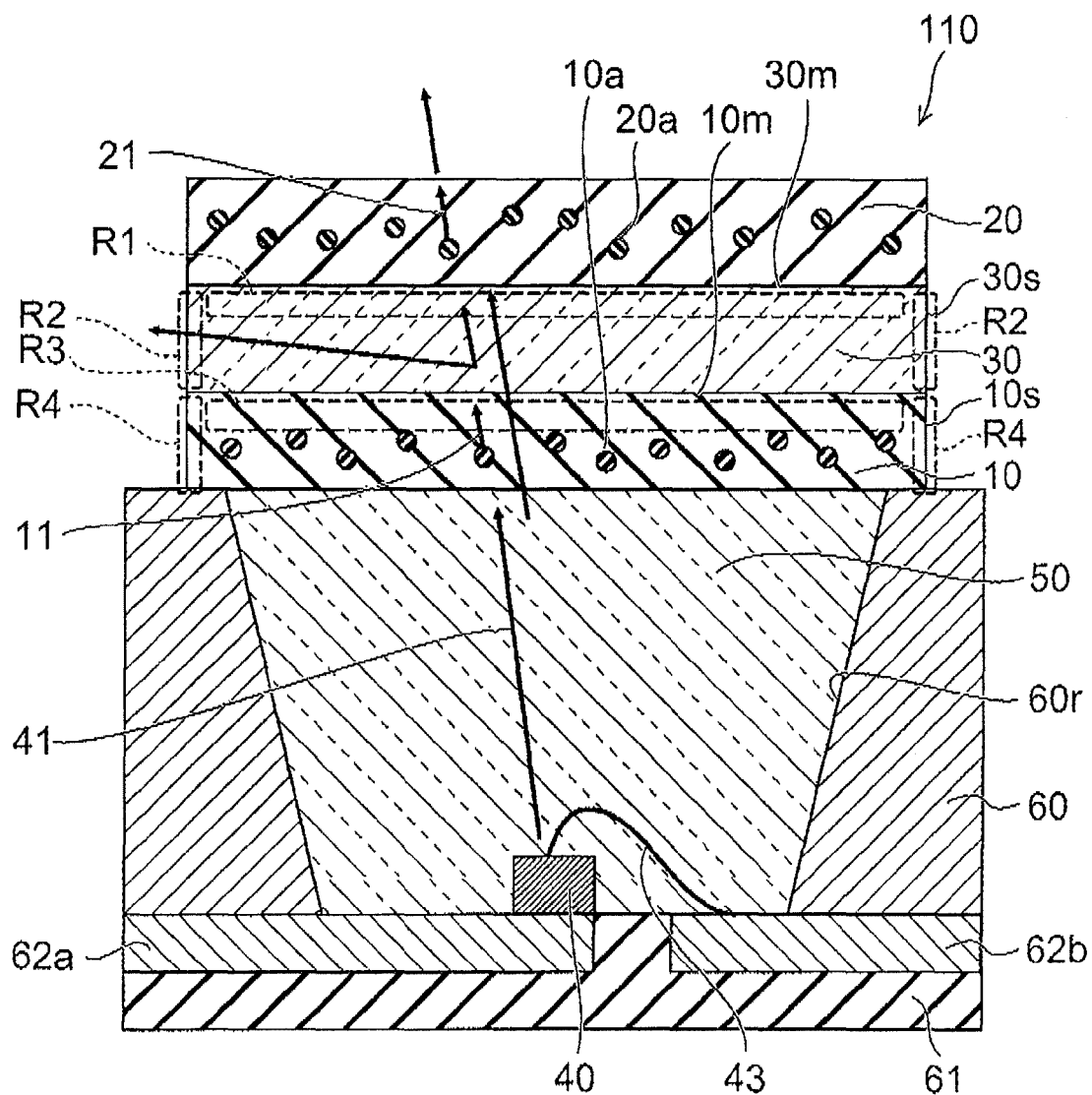
FIG. 1 is a schematic cross-sectional view illustrating a light emitting device according to a first embodiment.

FIG. 1 is a schematic cross-sectional view illustrating the configuration of a light emitting device according to a first embodiment of the invention.

As shown in FIG. 1, a light emitting device 110 according to the first embodiment includes a light source 40, which emits source light 41, a first wavelength conversion portion 10 where the source light 41 enters, a light transmitting portion 30 provided at the opposite side of the first wavelength conversion portion 10 from the light source 40, and a second wavelength conversion portion 20 provided at the opposite side of the light transmitting portion 30 from the first wavelength conversion portion 10.

In other words, the light transmitting portion 30 is provided between the first wavelength conversion portion 10 and the second wavelength conversion portion 20, and the first wavelength conversion portion 10 is provided between the light source 40 and the second wavelength conversion portion 20.

The first wavelength conversion portion 10 absorbs the source light 41 and emits first light 11 having a wavelength different from a wavelength of the source light 41.

The light transmitting portion 30 transmits the source light 41 and the first light 11.

The second wavelength conversion portion 20 absorbs at least one of the source light 41 and the first light 11 and emits second light 21 having a wavelength different from the wavelength of the source light 41 and also different from the wavelength of the first light 11.

Part of the source light 41 is taken to the outside of the light emitting device 110 without passing through at least one of the first wavelength conversion portion 10 and the second wavelength conversion portion 20.

For example, in this specific example, the light transmitting portion 30 includes a first region R1 covered with the second wavelength conversion portion 20 and a second region R2 not covered with the second wavelength conversion portion 20.

For example, the second region R2 not covered with the second wavelength conversion portion 20 includes at least one of part of a main surface 30m of the light transmitting portion 30, which faces the second wavelength conversion portion 20, and at least part of side surfaces 30s of the light transmitting portion 30. The side surfaces 30s of the light transmitting portion 30 are, for example, surfaces, which are in contact with the main surface 30m of the light transmitting portion 30 and which do not face the main surface 30m.

In the light emitting device 110 of this specific example, the second region R2 includes the side surfaces 30s of the light transmitting portion 30. In other words, the side surfaces 30s of the light transmitting portion 30 are not covered with the second wavelength conversion portion 20.

Thus, part of the source light 41 is taken to the outside without passing through the second wavelength conversion portion 20.

The first wavelength conversion portion 10 may include a third region R3 covered with the second wavelength conversion portion 20 and a fourth region R4 not covered with the second wavelength conversion portion 20. The fourth region R4 may include at least one of part of a main surface 10m of the first wavelength conversion portion 10, which faces the light transmitting portion 30, and at least part of side surfaces 10s of the first wavelength conversion portion 10.

In the light emitting device 110 of this specific example, the fourth region R4 includes the side surfaces 10s of the first wavelength conversion portion 10. In other words, the side surfaces 10s of the first wavelength conversion portion 10 are not covered with the second wavelength conversion portion 20.

The first wavelength conversion portion 10 includes, for example, a resin layer and a first fluorescent material 10a dispersed in the resin layer. The first fluorescent material 10a emits the first light 11.

The second wavelength conversion portion 20 includes, for example, a resin layer and a second fluorescent material 20a dispersed in the resin layer. The second fluorescent material 20a emits the second light 21.

For example, the wavelength of the second light 21 is desirably longer than the wavelength of the first light 11. Further, the wavelength of the first light 11 is desirably longer than the wavelength of the source light 41. The source light 41 is ultraviolet to blue light; the first light 11 is, for example, green to yellow light; and the second light 21 is, for example, red light. However, the invention is not limited to this. The source light 41, the first light 11, and the second light 21 may have any wavelengths and wavelength distributions.

The light transmitting portion 30 transmits the source light 41 and the first light 11. The light transmitting portion 30 may be a resin layer made of a transparent silicone resin or the like containing no fluorescent material, for example. The light transmitting portion 30 may be a gas layer of air, nitrogen, or the like, a vacuum layer, or the like. Alternatively, as will be described later, the light transmitting portion 30 may be a composite including supports fixing the first wavelength conversion portion 10 and the second wavelength conversion portion 20 to each other and, for example, an air layer provided around the supports.

In the description below, it is assumed that a transparent resin is used as the light transmitting portion 30.

In the light emitting device 110 of this specific example, the light source 40 is disposed on a bottom portion of a depressed portion 60r of a package 60. The package 60 includes a substrate 61 (base body) in which a first electrode 62a and a second electrode 62b are provided. The light source 40 is disposed on, for example, the first electrode 62a of the substrate 61. An electrode provided, for example, in a lower surface of the light source 40 is electrically connected to the first electrode 62a of the substrate 61. On the other hand, another electrode of the light source 40 and the second electrode 62b of the substrate 61 are electrically connected to each other with, for example, a wiring 43. For example, supplying power to the light source 40 through the first electrode 62a and the second electrode 62b causes the light source 40 to be luminous and emit the source light 41.

In this specific example, a light transmitting layer 50, which transmits the source light 41, is provided in the depressed portion 60r of the package 60. The source light 41 passes through the light transmitting layer 50 to enter the first wavelength conversion portion 10. The light transmitting layer 50 may be a resin layer made of a transparent silicone resin or the like. Alternatively, the light transmitting layer 50 may be a gas layer of air, nitrogen, or the like, a vacuum layer, or the like. In the description below, it is assumed that a transparent resin is used as the light transmitting layer 50.

In other words, in the light emitting device 110, the source light 41 passes through the light transmitting layer 50 and enters a laminated structure including the first wavelength conversion portion 10, the light transmitting portion 30, and the second wavelength conversion portion 20.

With the light emitting device 110 having the above-described structure, a light emitting device, which emits light of desired color with high efficiency, can be provided.

Figure 2:
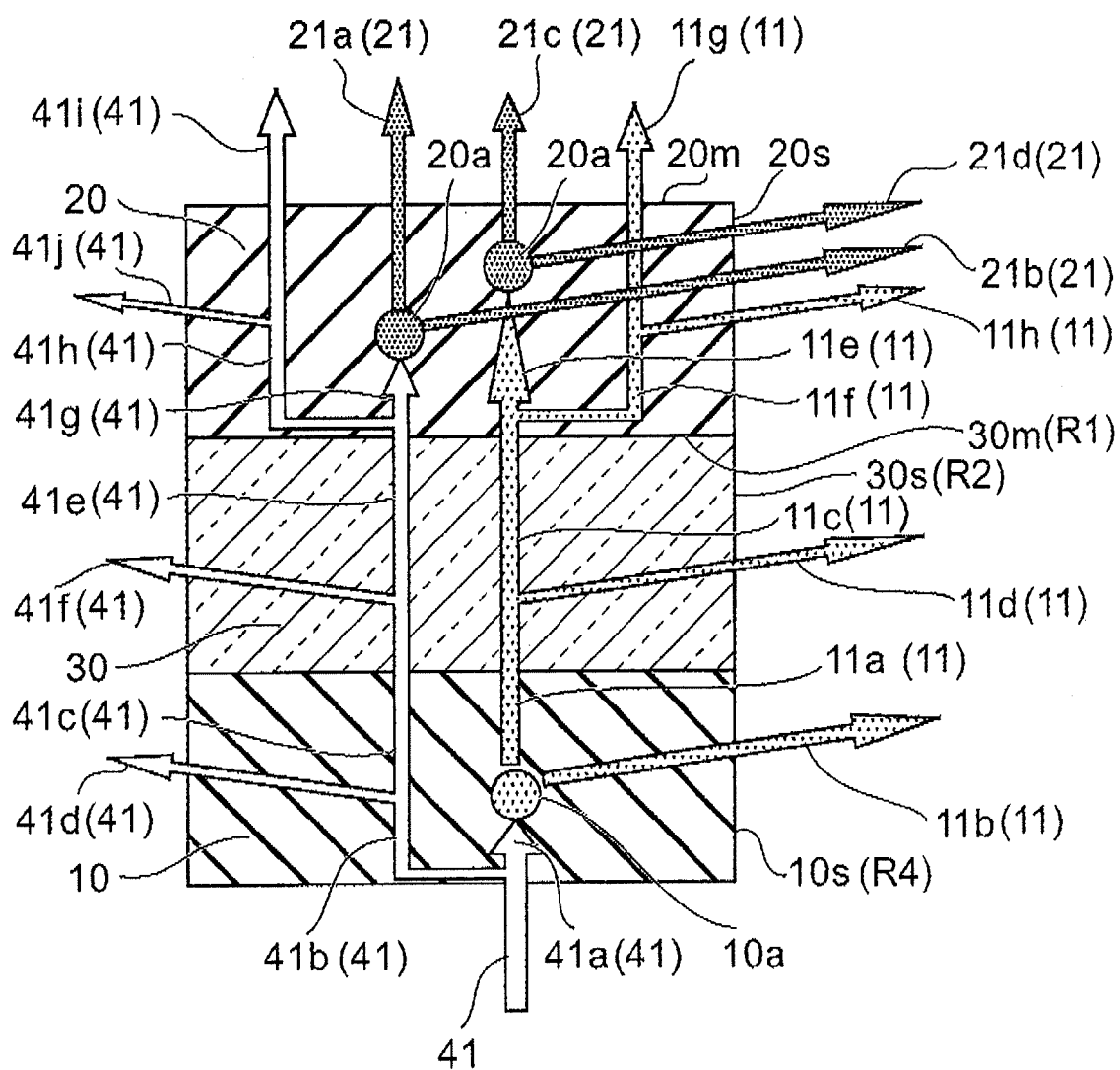
FIG. 2 is a schematic view illustrating the operation of the light emitting device.

FIG. 2 is a schematic view illustrating the operation of the light emitting device according to the first embodiment of the invention.

As shown in FIG. 2, the source light 41 emitted from the light source 40 reaches the first wavelength conversion portion 10. In the first wavelength conversion portion 10, light 41a, which is part of the source light 41, has a wavelength converted by the first fluorescent material 10a. Thus, the first light 11 is emitted.

Light 11a, which is part of the first light 11, enters the light transmitting portion 30.

Light 11c, which is part of the first light 11a that has entered the light transmitting portion 30, enters the second wavelength conversion portion 20. On the other hand, light 11d, which is other part of the first light 11a that has entered the light transmitting portion 30, does not reach the second wavelength conversion portion 20 and is emitted to the outside from the side surfaces 30s as the second region R2 of the light transmitting portion 30.

Light 11b, which is other part of the first light 11, does not reach the light transmitting portion 30 and is emitted to the outside from the side surfaces 10s as the fourth region R4 of the first wavelength conversion portion 10.

On the other hand, light 41c, which is part of light 41b as other part of the source light 41 that has entered the first wavelength conversion portion 10, enters the light transmitting portion 30.

Light 41d, which is other part of the light 41b, does not reach the light transmitting portion 30 and is emitted to the outside from the side surfaces 10s as the fourth region R4 of the first wavelength conversion portion 10.

Light 41e, which is part of the light 41c that has entered the light transmitting portion 30, passes through the light transmitting portion 30 and reaches the second wavelength conversion portion 20. Light 41f, which is other part of the light 41c, does not reach the second wavelength conversion portion 20 and is emitted to the outside from the side surfaces 30s as the second region R2 of the light transmitting portion 30.

Light 41g, which is part of the light 41e that has reached the second wavelength conversion portion 20, has a wavelength converted by the second fluorescent material 20a of the second wavelength conversion portion 20. Thus, the second light 21 is emitted. Light 21a, which is part of the second light 21, is emitted from a main surface 20m of the second wavelength conversion portion 20. Light 21b, which is other part of the second light 21, is emitted from side surfaces 20s of the second wavelength conversion portion 20.

Light 41h, which is other part of the light 41e that has reached the second wavelength conversion portion 20, is emitted from the second wavelength conversion portion 20 without being converted by the second wavelength conversion portion 20. For example, light 41i, which is part of the light 41h, is emitted from the main surface 20m of the second wavelength conversion portion 20; meanwhile, light 41j, which is other part of the light 41h, is emitted from the side surfaces 20s of the second wavelength conversion portion 20.

On the other hand, light 11e, which is part of the light 11c as part of the first light 11 that has entered the second wavelength conversion portion 20, has a wavelength converted by the second fluorescent material 20a of the second wavelength conversion portion 20. Thus, the second light 21 is emitted. Light 21c, which is part of the second light 21 based on the first light 11, is emitted from the main surface 20m of the second wavelength conversion portion 20; meanwhile, light 21d, which is other part of the second light 21, is emitted from the side surfaces 20s of the second wavelength conversion portion 20.

Light 11f, which is other part of the light 11c that has reached the second wavelength conversion portion 20, is emitted from the second wavelength conversion portion 20 without being converted by the second wavelength conversion portion 20. For example, light 11g, which is part of the light 11f, is emitted from the main surface 20m of the second wavelength conversion portion 20; meanwhile, light 11h, which is other part of the light 11f, is emitted from the side surfaces 20s of the second wavelength conversion portion 20.

As described above, the second wavelength conversion portion 20 absorbs at least one of the source light 41 and the first light 11 and emits the second light 21. The second light 21 (light 21a and 21b) based on the source light 41 and the second light 21 (light 21c and 21d) based on the first light 11 may have slightly different wavelength spectra, but substantially have the same hue. These can be considered to be the same wavelength spectra.

As described above, in the light emitting device 110 according to this embodiment, the light transmitting portion 30 includes not only the first region R1 covered with the second wavelength conversion portion 20 but also the second region R2 not covered with the second wavelength conversion portion 20. Accordingly, the light 41f, which is part of the source light 41, can be emitted from the second region R2. Further, the light 11d, which is part of the first light 11, can be emitted from the second region R2.

Moreover, in this specific example, the first wavelength conversion portion 10 includes not only the third region R3 covered with the second wavelength conversion portion 20 but also the fourth region R4 not covered with the second wavelength conversion portion 20. Accordingly, the light 41d, which is part of the source light 41, can be emitted from the fourth region R4. Further, the light 11b, which is part of the first light 11, can be emitted from the fourth region R4.

Here, the source light 41 emitted outside the light emitting device 110 is the light 41d, the light 41f, the light 41i, and the light 41j.

Further, the first light 11 emitted outside the light emitting device 110 is the light 11b, the light 11d, the light 11g, and the light 11h.

In the case of a comparative example where the entire light transmitting portion 30 is covered with the second wavelength conversion portion 20 and in which the entire first wavelength conversion portion 10 is covered with the second wavelength conversion portion 20, the source light 41 emitted outside the light emitting device is the light 41i and the light 41j; further, the first light 11 emitted outside the light emitting device is the light 11g and the light 11h. In the case of this comparative example, since the source light 41 and the first light 11 are emitted to the outside through the second wavelength conversion portion 20, energy is lost in the second wavelength conversion portion 20. Specifically, part of the source light 41 and the first light 11, which have entered the second wavelength conversion portion 20, are absorbed by the second fluorescent material 20a and wavelength-converted, but the other part thereof are absorbed without being wavelength-converted in the second wavelength conversion portion 20. This causes energy loss.

In contrast, in the light emitting device 110 according to this embodiment, part of the source light 41 and part of the first light 11 can be emitted from the second region R2 of the light transmitting portion 30 and can also be emitted from the fourth region R4 of the first wavelength conversion portion 10. This reduces the amount of light absorbed in the second wavelength conversion portion 20. As a result, energy loss can be suppressed.

Thus, a light emitting device, which emits light of desired color with high efficiency, can be provided.

It should be noted that this specific example is an example where the light transmitting portion 30 includes the second region R2 and where the first wavelength conversion portion 10 includes the fourth region R4. However, the invention is not limited to this as long as the light transmitting portion 30 includes the second region R2.

The second wavelength conversion portion 20 absorbs at least one of the source light 41 and the first light 11 and emits the second light 21. However, it is desirable from the point of view of the improvement of efficiency of generating the second light 21 that the amount of the second light 21 components based on the source light 41 is larger than the amount of the second light 21 components based on the first light 11. In other words, it is desirable that the second wavelength conversion portion 20 principally absorbs the source light 41 to emit the second light 21. However, the invention is not limited to this. The second wavelength conversion portion 20 may be configured to be excited by the first light 11 rather than the source light 41 to emit the second light. In this case as well, energy loss can be suppressed by taking the source light 41, which does not pass through the second wavelength conversion portion 20, directly out of the second region R2 of the light transmitting portion 30.

The above description has been given of the travel of light in a direction from the light source 40 side toward the second wavelength conversion portion 20. However, each light also travels in directions other than the direction from the light source 40 side toward the second wavelength conversion portion 20 by: reflection at the interface of the first wavelength conversion portion 10 at the light source 40 side, the interface between the first wavelength conversion portion 10 and the light transmitting portion 30, the interface between the light transmitting portion 30 and the second wavelength conversion portion 20, the interface between the second wavelength conversion portion 20 and the outside, and the like; scattering in the first wavelength conversion portion 10, the light transmitting portion 30, and the second wavelength conversion portion 20; and the like. Since the light traveling in the above-described various directions can also be taken out from the second region R2 of the light transmitting portion 30, the efficiency is improved.

The ratio between the amount of the source light 41 entering the second wavelength conversion portion 20 and the amount of the source light 41 emitted from the second region R2 of the light transmitting portion 30 can be controlled by, for example, controlling radiation properties and orientation distribution of the source light 41 emitted from the light source 40, scattering properties and the like of the first wavelength conversion portion 10, and the thickness of the light transmitting portion 30 (the length along the stacking direction of the first wavelength conversion portion 10, the light transmitting portion 30, and the second wavelength conversion portion 20).

For example, in the case where the source light 41 emitted from the light source 40 is emitted to spread outward, increasing the thickness of the light transmitting portion 30 increases the amount of the source light 41 emitted from the second region R2 of the light transmitting portion 30.

When the source light 41, the first light 11, and the second light 21 are synthesized to generate synthesized light such as white light, for example, it is desirable for the sake of suppressing a luminous efficiency reduction due to the loss of the source light 41, for example, that the source light 41 (and the first light) allowed to enter the second wavelength conversion portion 20 and wavelength-converted be at a minimum amount needed to generate the second light 21 and that a lowest possible amount of the source light 41, which is used as a component of the synthesized light, be emitted to the outside without passing through the second wavelength conversion portion 20.

Accordingly, for example, in the case where the source light 41 is emitted from the light source 40 to spread outward, it is desirable that the thickness of the light transmitting portion 30 be sufficiently large.

The thickness of the first wavelength conversion portion 10 and the second wavelength conversion portion 20 may be set to, for example, 100 µm (micrometers) to 200 µm. The thickness of the light transmitting portion 30 may be set to 50 µm to 500 µm. However, the invention is not limited to this. The first wavelength conversion portion 10, the second wavelength conversion portion 20, and the light transmitting portion 30 may have any thickness.

The aforementioned relationship expressed by the ratio between the amount of the source light 41 entering the second wavelength conversion portion 20 and the amount of the source light 41 directly taken out without entering the second wavelength conversion portion 20 applies not only to the relationship between the source light 41 and the second wavelength conversion portion 20 but also to the relationships between each component of the synthesized light generated from the light emitting device 110 and all the wavelength conversion portions included in the light emitting device 110. For example, a similar relationship applies to the relationship between the source light 41 and the first wavelength conversion portion 10, the relationship between the first light 11 and the second wavelength conversion portion 20, the relationship between the first light 11 and the first wavelength conversion portion 10, and the relationship between the second light 21 and the first wavelength conversion portion 10.

For example, it is desirable that the source light 41 allowed to enter the first wavelength conversion portion 10 is at a minimum amount needed to generate the first light 11 by conversion by the first wavelength conversion portion 10 and that a lowest possible amount of the source light 41, which is emitted to the outside as the source light 41, is emitted directly to the outside without passing through the first wavelength conversion portion 10.

Similarly, it is desirable that the first light 11 is emitted directly to the outside without reaching the second wavelength conversion portion 20. Further, it is desirable that the second light 21 is emitted directly to the outside without reaching the first wavelength conversion portion 10.

The absorption of the first light 11 by the second wavelength conversion portion 20 (second fluorescent material 20a) and the absorption of the second light 21 by the first wavelength conversion portion 10 (first fluorescent material 10a) are phenomena generally called re-absorption of light among a plurality of fluorescent materials. This causes energy loss; therefore, it is desired to avoid.

In this respect, in the light emitting device 110 according to this embodiment, the light transmitting portion 30 is provided between the first wavelength conversion portion and the second wavelength conversion portion 20 to reduce the amount of light entering one of the first wavelength conversion portion 10 and the second wavelength conversion portion 20 from the other. Thus, energy loss can be suppressed.

As described above, the light emitting device 110 has the laminated structure in which the light transmitting portion 30 (e.g., a light transmissive layer containing no fluorescent material) is provided between different types of fluorescent material layers (wavelength conversion portions). This makes it possible to suppress a luminous efficiency reduction due to the phenomena in which a fluorescent material emitting light with longer wavelengths reabsorbs light emitted by another fluorescent material.

In a structure including the first wavelength conversion portion 10 and the second wavelength conversion portion 20 and further including an adhering layer provided therebetween to adhere the first wavelength conversion portion 10 and the second wavelength conversion portion 20 to each other, this adhering layer only needs to have the function of adhering the two portions. Accordingly, the thickness of the adhering layer is approximately 10 µm or smaller. In the case where the thickness of the adhering layer is approximately 10 µm or smaller as described above, the amount of light taken out from side surfaces of the adhering layer is significantly small, and therefore the aforementioned effect is hard to obtain.

Accordingly, in the light emitting device 110 according to this embodiment, in the case where the second region R2 is the side surfaces 30s of the light transmitting portion 30, the thickness of the light transmitting portion 30 is desirably set to 50 µm to 500 µm. Specifically, in the case of a thickness smaller than 50 µm, since the amount of light taken out from the second region R2 of the light transmitting portion 30 is small, the effect of improving efficiency is small. Further, in the case of a thickness larger than 500 µm, since the amount of light entering the second wavelength conversion portion 20 is conversely small, the efficiency decreases.

However, the second region R2 may be provided not only in the side surfaces 30s of the light transmitting portion 30 but also in the main surface 30m as described later. In this case, the aforementioned condition relating to the thickness of the light transmitting portion 30 may not necessarily be satisfied.

Figure 3:
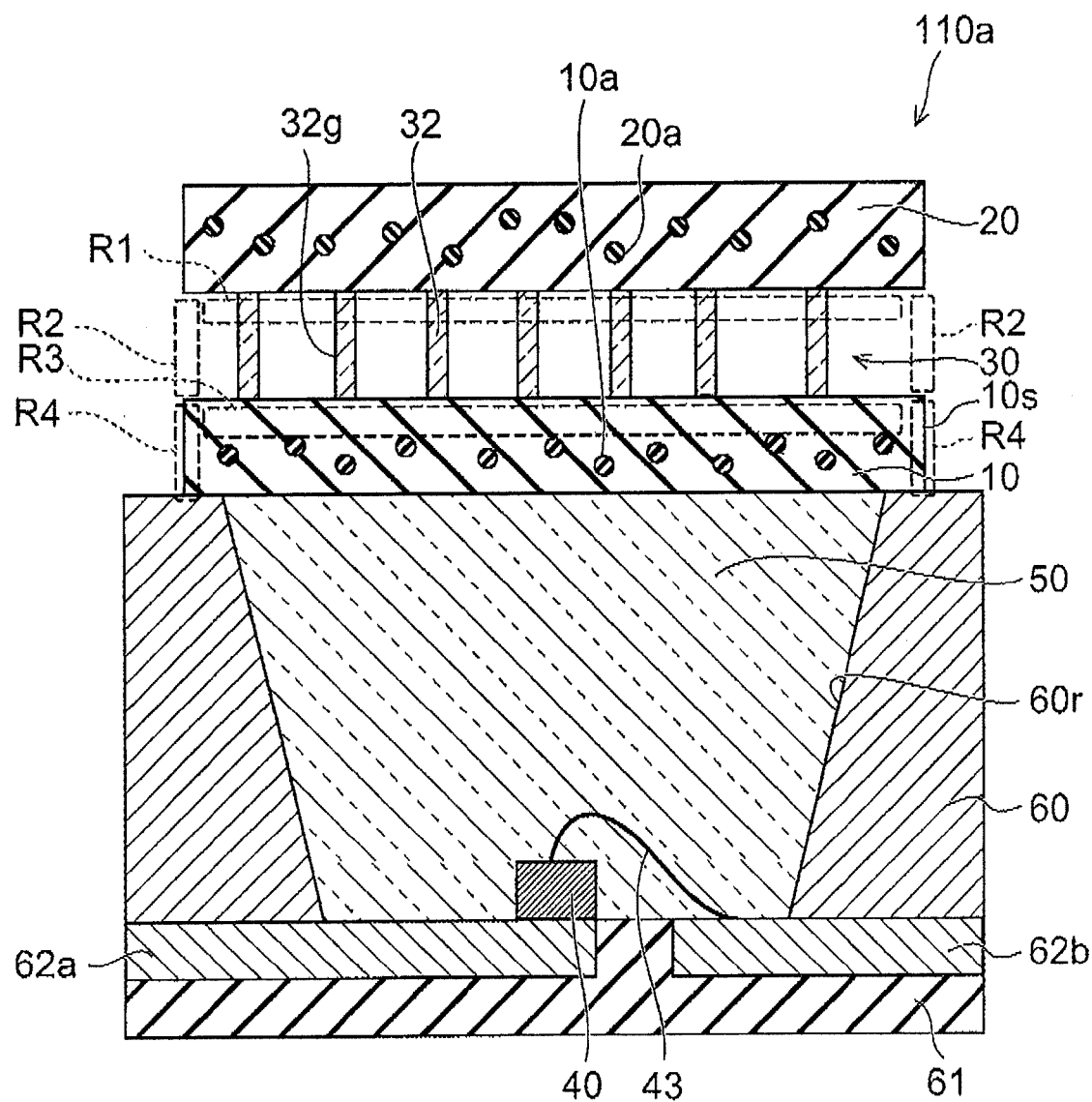
FIG. 3 is a schematic cross-sectional view illustrating the light emitting device.

FIG. 3 is a schematic cross-sectional view illustrating the configuration of another light emitting device according to the first embodiment of the invention.

As shown in FIG. 3, in another light emitting device 110a according to this embodiment, the light emitting device 110 shown as an example in FIG. 1 is modified as follows: the light transmitting portion 30 includes supports 32 provided in contact with part of the first wavelength conversion portion 10 and part of the second wavelength conversion portion 20, and the supports 32 support the second wavelength conversion portion 20. Thus, a gap 32g is provided in a portion, not including the supports 32, between the first wavelength conversion portion 10 and the second wavelength conversion portion 20. Other than these, the light emitting device 110a is the same as the light emitting device 110, and a description will be omitted.

In this case, the light transmitting portion 30 can be considered as a composite of the supports 32 and, for example, an air layer in the gap 32g provided around the supports 32.

In the case where the ratio of the cross-sectional areas of the supports 32 (areas of cross sections cut by a plane perpendicular to the lamination direction of the first wavelength conversion portion 10, the light transmitting portion 30, and the second wavelength conversion portion 20) to the main surface 30m of the light transmitting portion 30 is small, the light transmitting portion 30 between the first wavelength conversion portion 10 and the second wavelength conversion portion 20 can be considered to be substantially the gap 32g. Thus, the light transmitting portion 30 may be substantially the gap 32g. In this case, a light emitting device, which emits light of desired color with high efficiency, can also be provided by the effect described in relation to FIG. 2.

The above-described light transmitting portion 30 can be formed by, for example, fabricating a laminated sheet on at least one of the mutually facing surfaces of the first wavelength conversion portion 10 and the second wavelength conversion portion 20 by any method, e.g., printing, potting, ink jetting, or the like. The laminated sheet is fabricated by forming resin base members made of, for example, an adhesive or the like to be the supports 32, stacking the first wavelength conversion portion 10 and the second wavelength conversion portion 20 with the resin base members interposed therebetween, curing the resin base members, and adhering the first wavelength conversion portion 10 and the second wavelength conversion portion 20 with the supports 32.

The laminated sheet is cut into a predetermined size. Thus, portions on side surfaces of the laminated sheet become the side surfaces 30s of the light transmitting portion 30. By bonding the cut laminated sheet to the package 60, the light emitting device 110a can be fabricated.

Figure 4A:
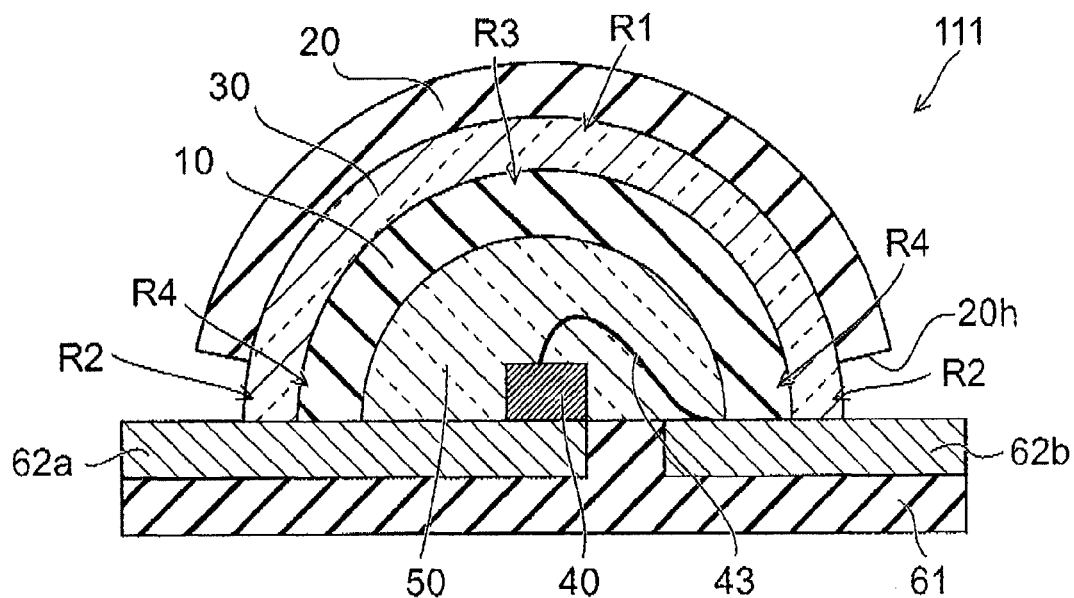
FIGS. 4A and 4B are schematic views illustrating the light emitting device.
Figure 4B:
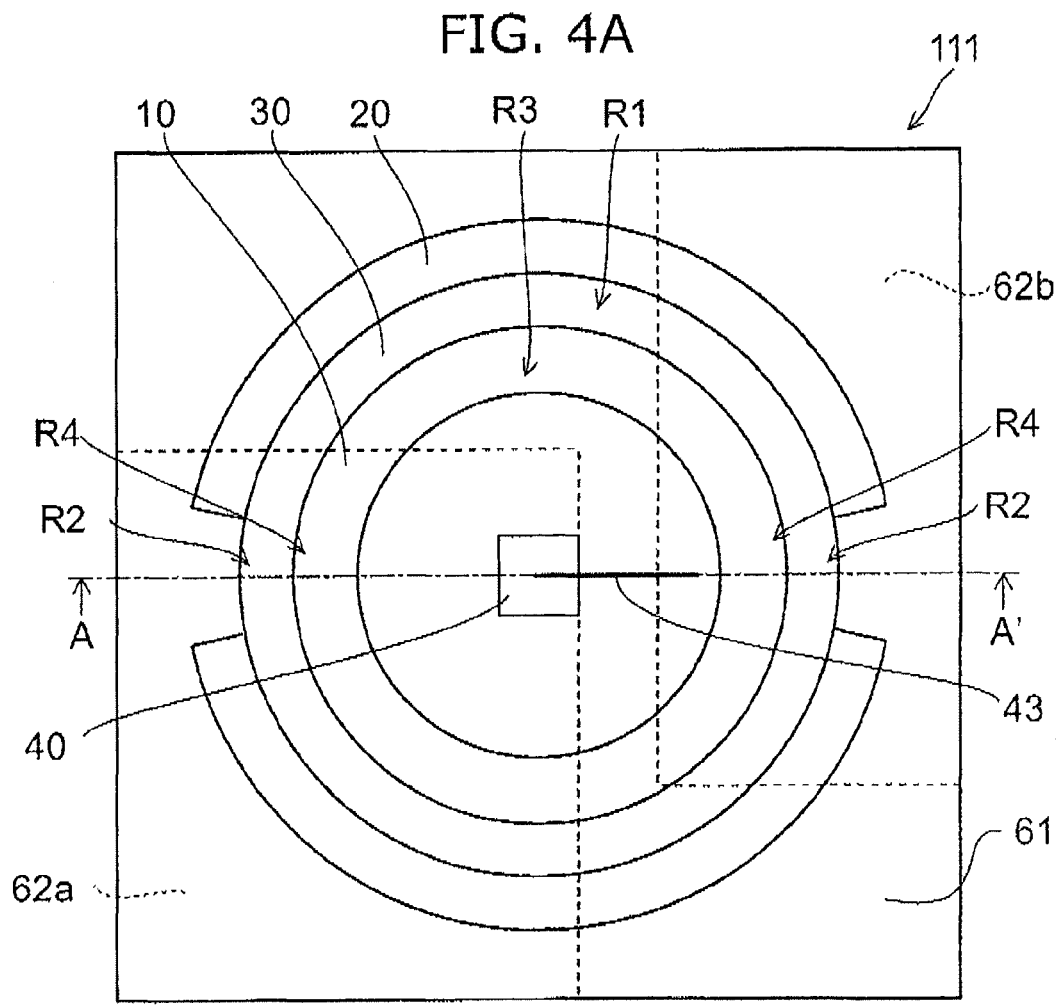

FIGS. 4A and 4B are schematic views illustrating the configuration of another light emitting device according to the first embodiment of the invention.

Specifically, FIG. 4A is a cross-sectional view taken along line A-A' of FIG. 4B, and FIG. 4B is a schematic plan view.

As shown in FIGS. 4A and 4B, in another light emitting device 111 according to this embodiment, the first wavelength conversion portion 10, the light transmitting portion 30, and the second wavelength conversion portion 20 each has a domal shape (domed shape, e.g., hemispherical shape). The light source 40 is disposed inside the first wavelength conversion portion 10 having a domal shape. In this case as well, the light transmitting layer 50 is provided between the light source 40 and the first wavelength conversion portion 10. The light transmitting layer 50 in this case may also be a resin layer containing no fluorescent material, a gas layer of air, nitrogen, or the like, a vacuum layer, or the like.

The light transmitting portion 30 may also be a resin layer containing no fluorescent material, a gas layer of air, nitrogen, or the like, a vacuum layer, or the like. As described in relation to the light emitting device 110a, the light transmitting portion 30 may be configured as a composite of the supports 32 and, for example, an air layer in the gap 32g provided around the supports 32.

In the light emitting device 111 having the above-described configuration, the light transmitting portion 30 also includes the first region R1 covered with the second wavelength conversion portion 20 and the second region R2 not covered with the second wavelength conversion portion 20. Further, the first wavelength conversion portion 10 includes the third region R3 covered with the second wavelength conversion portion 20 and the fourth region R4 not covered with the second wavelength conversion portion 20.

In other words, in the second wavelength conversion portion 20 of the light emitting device 111, portions of the domal shape are cut away, and the light transmitting portion 30 is not covered with the cut-away portions of the second wavelength conversion portion 20. The cut-away portions are holes 20h (second holes) provided in the second wavelength conversion portion 20. The holes 20h, for example, pierce the second wavelength conversion portion 20 in the direction of the thickness of the second wavelength conversion portion 20.

As described above, in the light emitting device 111 including the wavelength conversion portions having domal shapes, the second region R2 not covered with the second wavelength conversion portion 20 is also provided in the light transmitting portion 30. Thus, a light emitting device, which emits light of desired color with high efficiency by the effect described in relation to FIG. 2, can be provided.

In the light emitting device 111, the periphery (end portion facing the substrate 61) of the first wavelength conversion portion 10 is in contact with the substrate 61 and, for example, adhered to the substrate 61. The periphery of the light transmitting portion 30 is also in contact with the substrate 61.

On the other hand, end portions of the portions of the second wavelength conversion portion 20, which cover the light transmitting portion 30, are in contact with the substrate 61, but end portions of the portions of the second wavelength conversion portion 20, which do not cover the light transmitting portion 30, are separated from the substrate 61.

Figure 5A:
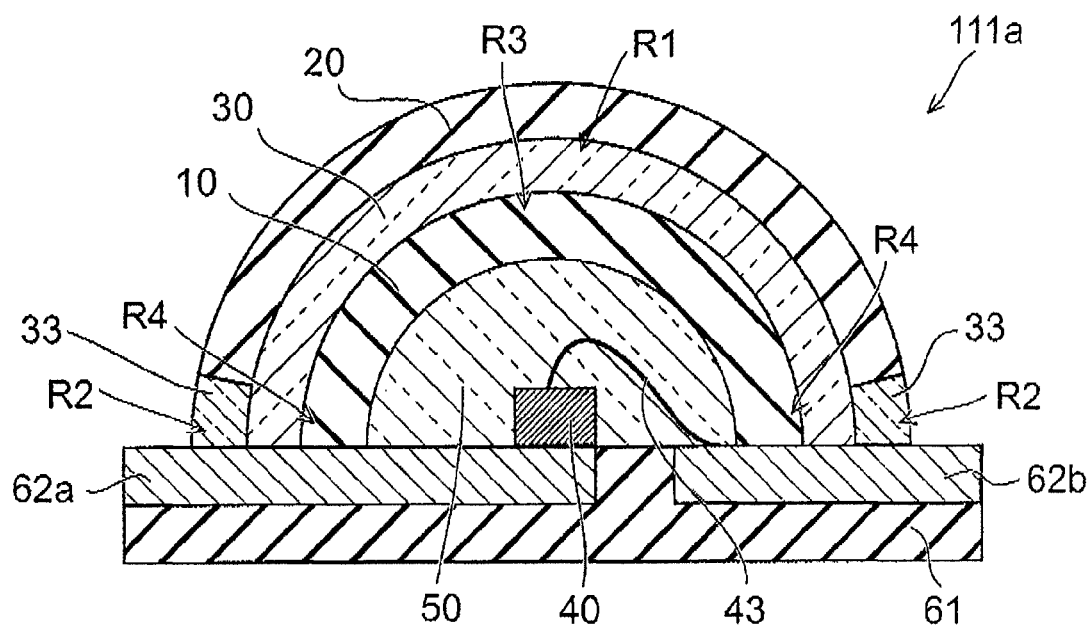
FIGS. 5A and 5B are schematic views illustrating the light emitting device.
Figure 5B:
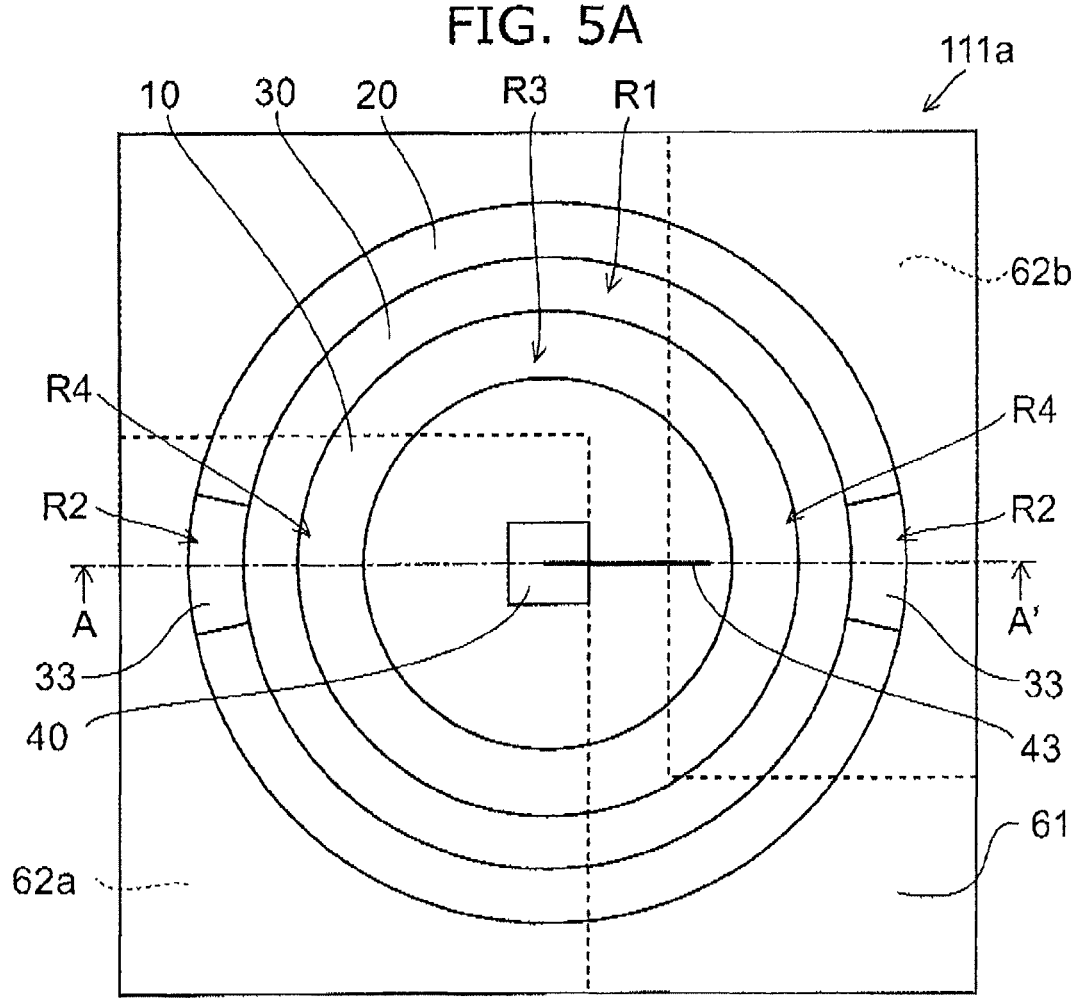

FIGS. 5A and 5B are schematic views illustrating the configuration of another light emitting device according to the first embodiment of the invention.

Specifically, FIG. 5A is a cross-sectional view taken along line A-A' of FIG. 5B, and FIG. 5B is a schematic plan view.

As shown in FIGS. 5A and 5B, in another light emitting device 111a according to this embodiment, the light emitting device 111 illustrated in FIGS. 4A and 4B is modified as follows: portions of the second wavelength conversion portion 20 having a domal shape are cut away, and, for example, light transmissive resin layers 33 containing no fluorescent material are provided in the portions (holes 20h). Other than this, the light emitting device 111a is the same as the light emitting device 111, and a description will be omitted.

In this case as well, the second region R2 (region not covered with the second wavelength conversion portion 20) of the light transmitting portion 30 is disposed in the portions in which the resin layers 33 are provided.

Part of the source light 41 is taken to the outside without passing through the second wavelength conversion portion 20.

As described above, the second wavelength conversion portion 20 may have the holes 20h, which pierce the second wavelength conversion portion 20 in the direction of the thickness of the second wavelength conversion portion 20. The light emitting device 111a may further include the resin layers 33, which are buried in the holes 20h and transmit the source light 41.

The resin layers 33 can be considered as elements separate from the light transmitting portion 30.

Alternatively, the resin layers 33 may be considered as part of the light transmitting portion 30. In this case, it can be considered that cut-away portions (holes 20h) are provided in the second wavelength conversion portion 20 and that the resin layers 33, which are part of the light transmitting portion 30, protrude in the cut-away portions (holes 20h).

Providing the above-described resin layers 33 causes the first wavelength conversion portion 10 and the light source 40 to be encapsulated by the second wavelength conversion portion 20 or the resin layers 33, and the substrate 61. Accordingly, the moisture resistance and the like can be improved, and the reliability can be improved.

Figure 6:
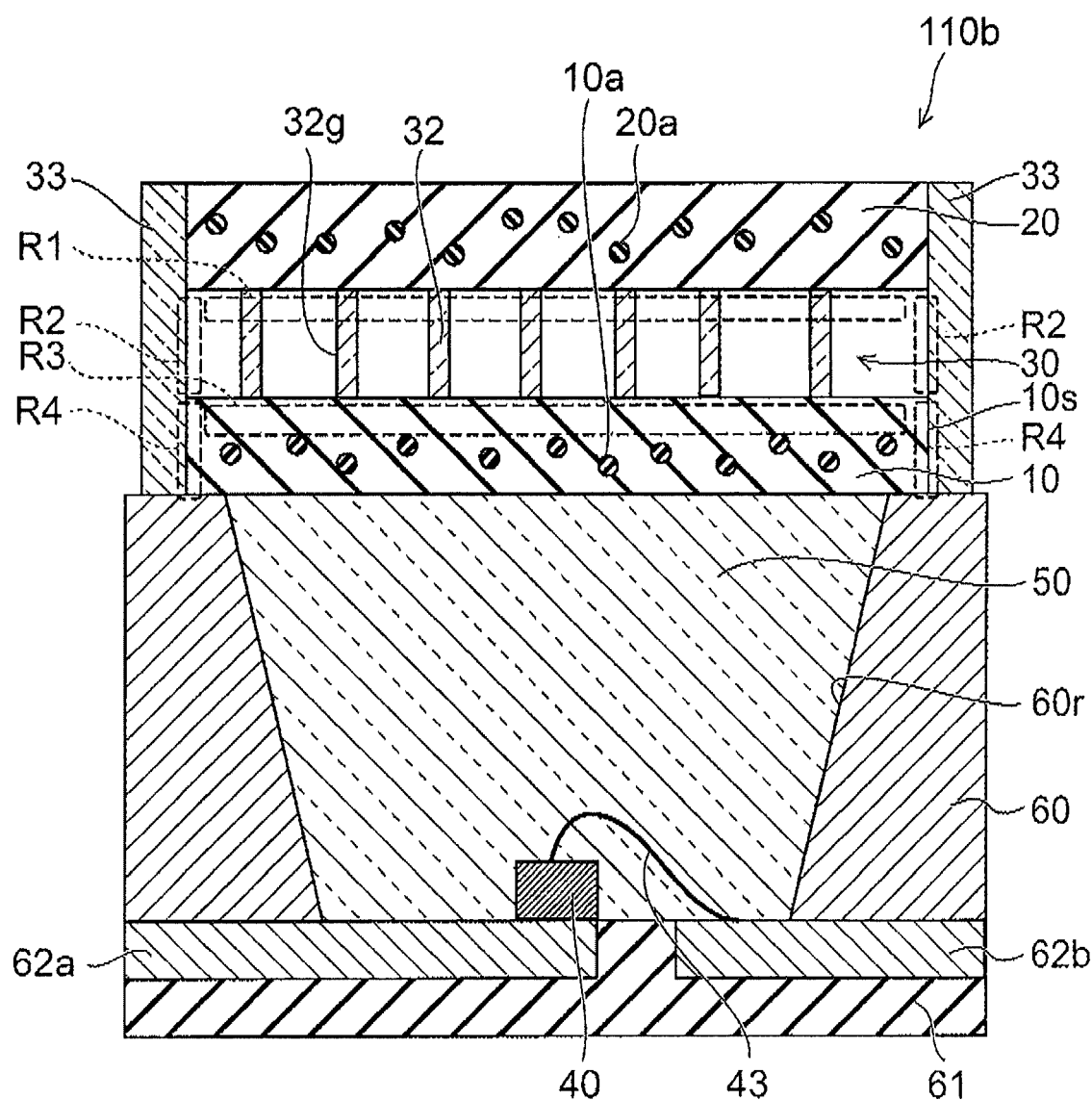
FIG. 6 is a schematic cross-sectional view illustrating the light emitting device.

FIG. 6 is a schematic cross-sectional view illustrating the configuration of another light emitting device according to the first embodiment of the invention.

As shown in FIG. 6, in another light emitting device 110b according to this embodiment, the light emitting device 110a illustrated in FIG. 3 is modified as follows: for example, light transmissive resin layers 33 containing no fluorescent material are provided on side surfaces of the first wavelength conversion portion 10, the light transmitting portion 30, and the second wavelength conversion portion 20, respectively. Other than these, the light emitting device 110b is the same as the light emitting device 110a, and a description will be omitted.

For example, in the case where the light transmitting portion 30 is configured as a composite of the supports 32 and, for example, an air layer in the gap 32g provided around the supports 32, the exposure of the air layer to the outside may allow external water and the like to enter the light transmitting portion 30 and cause phenomena such as condensation within the light transmitting portion 30 to reduce the efficiency and reliability. However, providing the light transmissive resin layers 33 on the side surfaces 30s of the light transmitting portion 30 as described above can suppress such reductions and is therefore more preferable.

In the light emitting device 110 illustrated in FIG. 1, the light transmissive resin layers 33 may be provided on the side surfaces of the first wavelength conversion portion 10, the light transmitting portion 30, and the second wavelength conversion portion 20, respectively.

Figure 7:
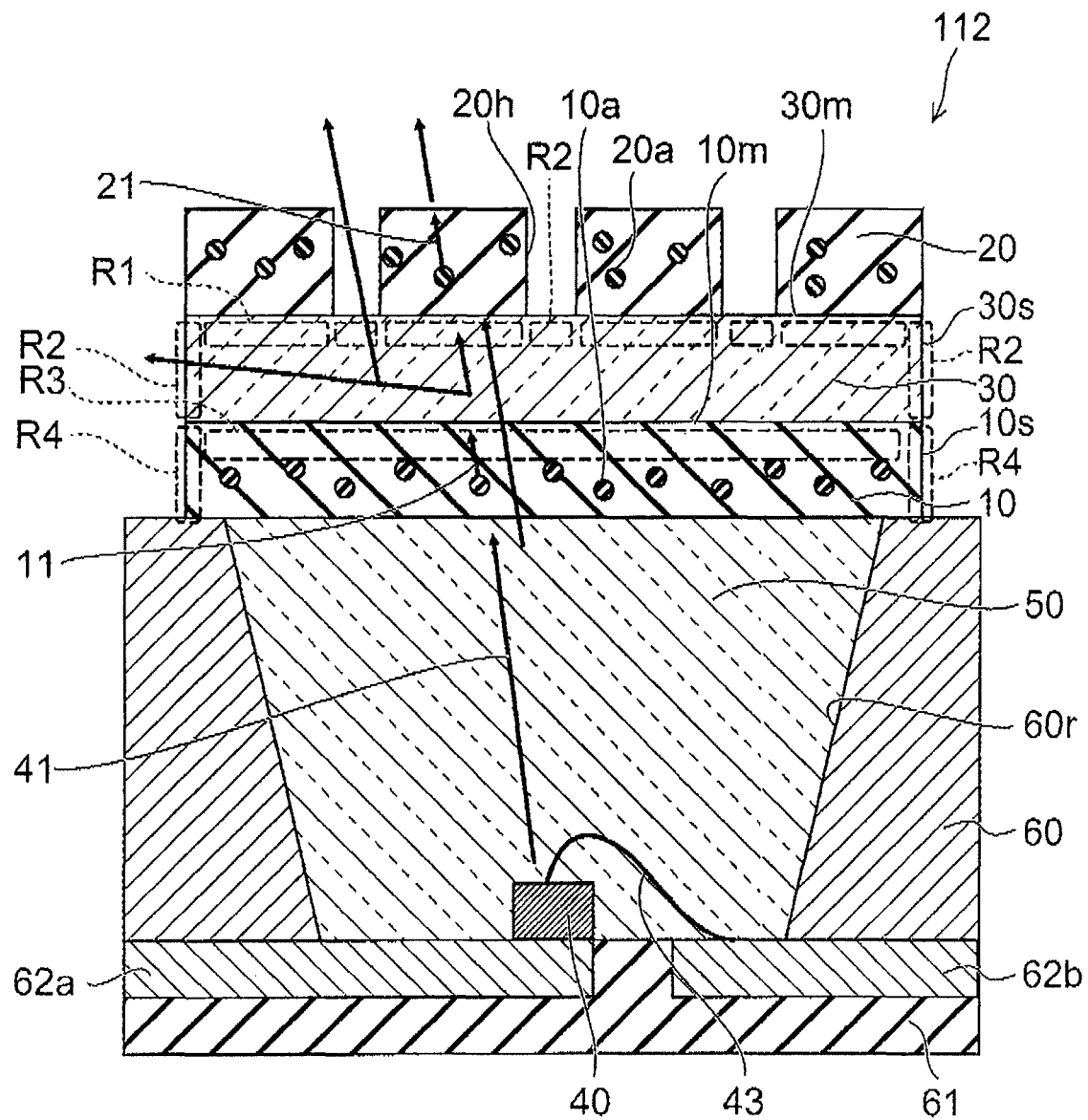
FIG. 7 is a schematic cross-sectional view illustrating the light emitting device.

FIG. 7 is a schematic cross-sectional view illustrating the configuration of another light emitting device according to the first embodiment of the invention.

As shown in FIG. 7, in another light emitting device 112 according to this embodiment, the light emitting device 110 illustrated in FIG. 1 is modified as follows: holes 20h, which pierce the second wavelength conversion portion 20 in the direction of the thickness thereof are provided in the second wavelength conversion portion 20. Other than this, the light emitting device 112 is the same as the light emitting device 110, and a description is omitted.

Specifically, in the light emitting device 112, the portions of the light transmitting portion 30, which correspond to the holes 20h of the second wavelength conversion portion 20, are not covered with the second wavelength conversion portion 20. Thus, the second region R2 is also disposed in the portions of the light transmitting portion 30, which correspond to the holes 20h. In other words, the second region R2 includes the side surfaces 30s of the light transmitting portion 30 and part of the main surface 30m of the light transmitting portion 30, which faces the second wavelength conversion portion 20.

It should be noted that this specific example is the case where the second region R2 includes both of the part of the main surface 30m of the light transmitting portion 30 and the side surfaces 30s of the light transmitting portion 30. However, the second region R2 may be configured to include the part of the main surface 30m without including the side surfaces 30s. Specifically, a configuration may be employed in which the second wavelength conversion portion 20 covers the side surfaces 30s of the light transmitting portion 30 and has the holes 20h provided therein and in which the part of the main surface 30m of the light transmitting portion 30 is not covered with the second wavelength conversion portion 20.

The second wavelength conversion portion 20 having the above-described holes 20h can be fabricated by, for example, forming the holes 20h in the second wavelength conversion portion 20 using a mold having protrusions, a needle, or the like when the second wavelength conversion portion 20 is formed in the form of a sheet. Then, a technique can be employed in which the second wavelength conversion portion 20 having the holes 20h are bonded to the first wavelength conversion portion 10 with the light transmitting portion 30 interposed therebetween.

Alternatively, after the formation of a laminated sheet including the first wavelength conversion portion 10, the light transmitting portion 30, and the second wavelength conversion portion 20, the holes 20h can be formed in the second wavelength conversion portion 20 using a mold having protrusions, a needle, or the like.

Alternatively again, the holes 20*h* may be formed in the second wavelength conversion portion 20 by laser machining the second wavelength conversion portion 20.

As described in relation to the light emitting device 110, the thickness of the light transmitting portion 30 is limited by light emitting device specifications and the like. Accordingly, there are cases where limitations are made on the improvement of efficiency made by increasing the thickness of the light transmitting portion 30. However, providing the holes 20*h* in the second wavelength conversion portion 20 as in the light emitting device 112 of this specific example can increase the amount of, for example, the source light 41 not passing through the second wavelength conversion portion 20. Thus, the efficiency can be further improved.

Moreover, for example, the chromaticity of light emitted from the light emitting device can also be adjusted by adjusting the ratio between the amount of the source light 41 entering the second wavelength conversion portion 20 and the amount of the source light 41 taken directly to the outside without entering the second wavelength conversion portion 20 by changing the areas, positions, sizes, number, and the like of the holes 20*h*.

Figure 8A:
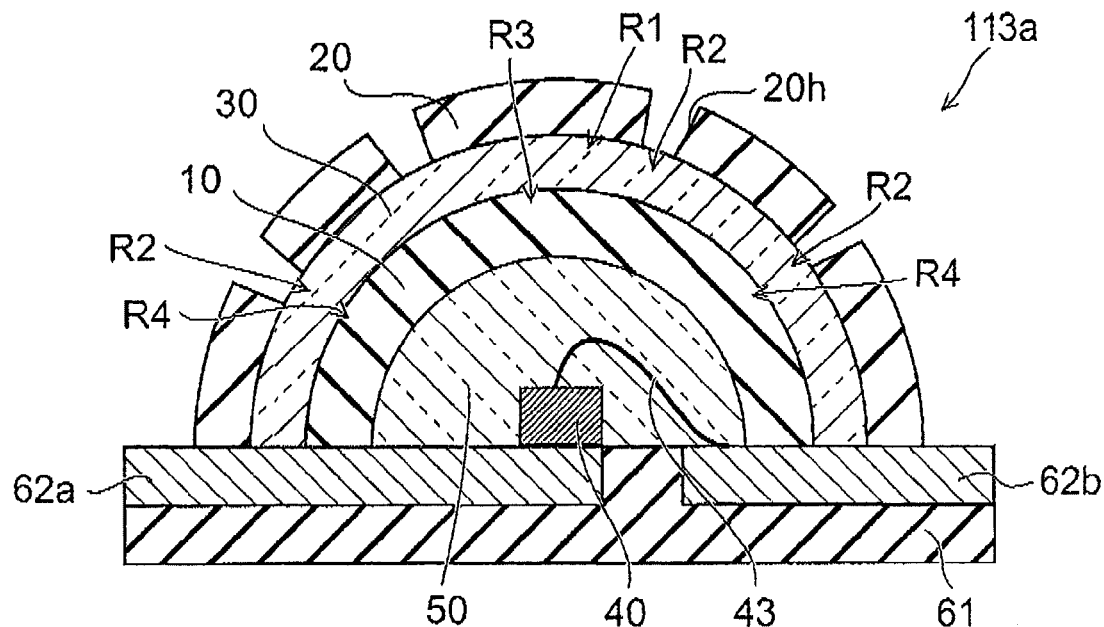
FIGS. 8A and 8B are schematic cross-sectional views illustrating the light emitting device.
Figure 8B:
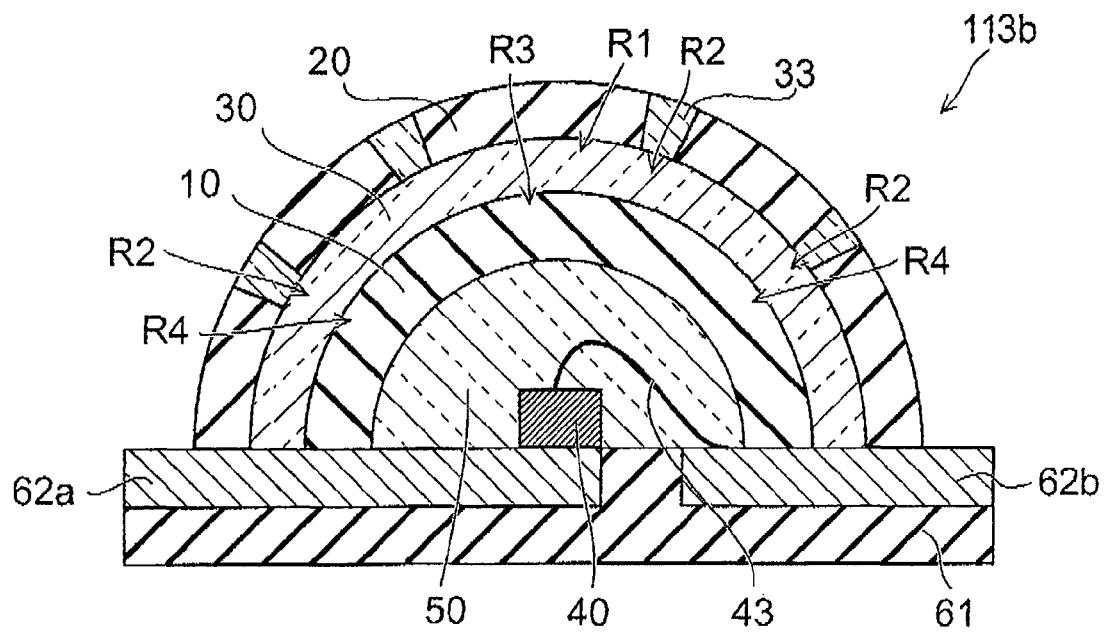

FIGS. 8A and 8B are schematic cross-sectional views illustrating the configurations of other light emitting devices according to the first embodiment of the invention.

As shown in FIG. 8A, in another light emitting device 113*a* according to this embodiment, the light emitting device 111 illustrated in FIGS. 4A and 4B is modified as follows: the peripheries of the first wavelength conversion portion 10 and the second wavelength conversion portion 20 are in contact with the substrate 61 and, for example, adhered to the substrate 61, and the holes 20*h* piercing the second wavelength conversion portion 20 in the direction of the thickness thereof are provided in the second wavelength conversion portion 20. Other than these, the light emitting device 113*a* may be the same as the light emitting device 111, and a description will be omitted.

As shown in FIG. 8B, in another light emitting device 113*b* according to this embodiment, the light emitting device 113*a* is modified as follows: for example, the transparent resin layers 33 containing no fluorescent material are provided in the portions of the holes 20*h* of the second wavelength conversion portion 20. The resin layers 33 can be considered as elements separate from the light transmitting portion 30 or may be considered as part of the light transmitting portion 30.

With the light emitting devices 113*a* and 113*b* having the above-described configurations, a light emitting device, which emits light of desired color with high efficiency by the effect described in relation to FIG. 2, can also be provided.

Moreover, the chromaticity of light emitted from the light emitting devices can also be adjusted by changing the areas, positions, sizes, number, and the like of the holes 20*h*.

Second Embodiment

Figure 9A:
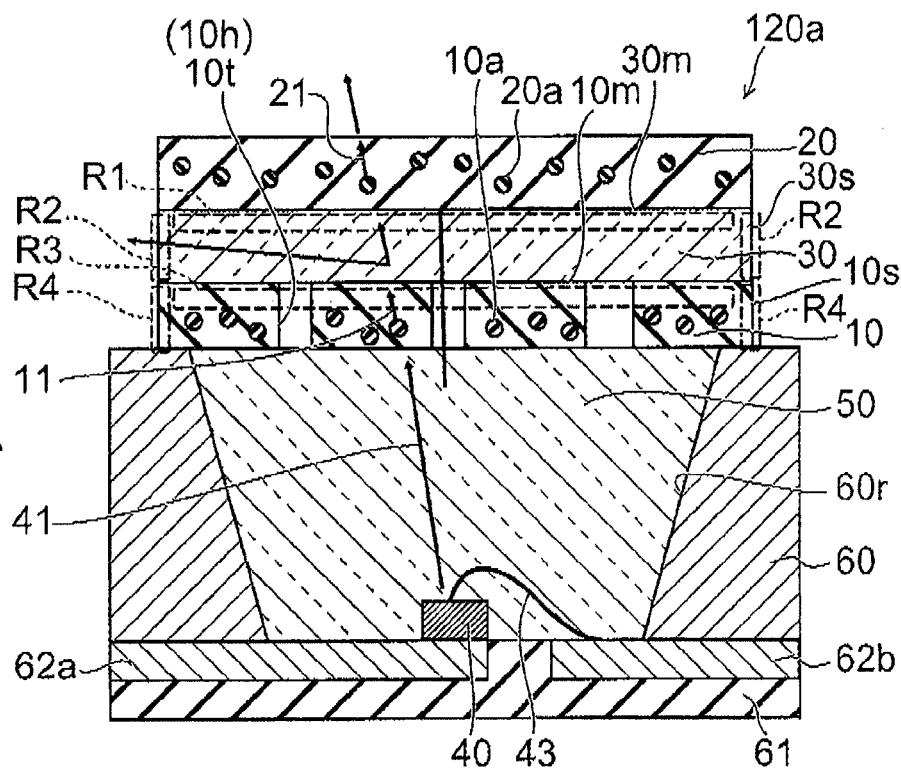
FIGS. 9A and 9B are schematic cross-sectional views illustrating a light emitting device according to a second embodiment.
Figure 9B:
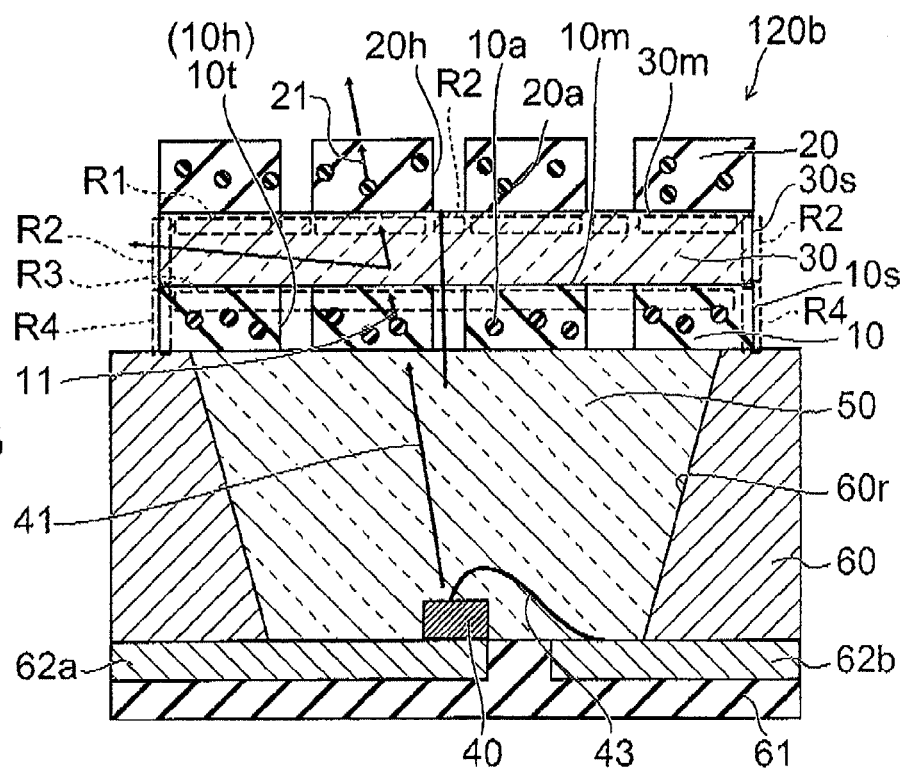

FIGS. 9A and 9B are schematic cross-sectional views illustrating the configurations of light emitting devices according to a second embodiment of the invention.

As shown in FIG. 9A, in a light emitting device 120*a* according to the second embodiment of the invention, the light emitting device 110 illustrated in FIG. 1 is modified as follows; holes 10*h* (first holes), which pierce the first wavelength conversion portion 10 in the direction of the thickness of the first wavelength conversion portion 10 are provided in the first wavelength conversion portion 10. Other than these, the light emitting device 120*a* is the same as the light emitting device 110, and a description will be omitted.

Thus, part of the source light 41 is taken to the outside without passing through the first wavelength conversion portion 10.

The holes 10*h* of the first wavelength conversion portion 10 serve as light transmitting regions lot. Specifically, the light transmitting regions 10*t*, for example, pierce the first wavelength conversion portion 10 in the direction of the thickness of the first wavelength conversion portion 10.

The light transmitting regions 10*t* are, for example, regions containing no fluorescent material, and regions, which have relatively higher transmittances for the source light 41 than portions of the first wavelength conversion portion 10 other than the light transmitting regions 10*t*. In other words, the light transmitting regions lot may be the holes 10*h* provided in the first wavelength conversion portion 10, or may be, for example, transparent resin layers, which are buried in the holes 10*h* provided in the first wavelength conversion portion 10 and contain no fluorescent material.

Providing the light transmitting regions 10*t* in the first wavelength conversion portion 10 as described above enables part of light (e.g., the light 41*b*, the light 41*c*, and the like illustrated in FIG. 2) of the source light 41 to enter the light transmitting portion 30 and the second wavelength conversion portion 20 without passing through the first wavelength conversion portion 10.

This can suppress the energy loss of the source light 41, which is caused in the regions of the first wavelength conversion portion 10 that contain the first fluorescent material 10*a*. Thus, a light emitting device, which emits light of desired color with high efficiency, can be provided.

In this specific example, the light transmitting portion 30 includes the first region R1 covered with the second wavelength conversion portion 20 and the second region R2 not covered with the second wavelength conversion portion 20 and, at the same time, the first wavelength conversion portion 10 includes the above-described light transmitting regions 10*t*. However, this embodiment can exert the above-described effect as long as the first wavelength conversion portion 10 includes the above-described light transmitting regions 10*t* (e.g., holes 10*h*).

As shown in FIG. 9B, another light emitting device 120*b* according to this embodiment is an example where, in the configuration of the above-described light emitting device 120*a*, the second wavelength conversion portion 20 has the holes 20*h*.

As shown in the drawing, the holes 20*h* can be provided in the second wavelength conversion portion 20 while the light transmitting regions 10*t* are provided in the first wavelength conversion portion 10.

In the above-described light emitting device 120*b*, part of the source light 41 is taken to the outside without passing through both the first wavelength conversion portion 10 and the second wavelength conversion portion 20.

Figure 10A:
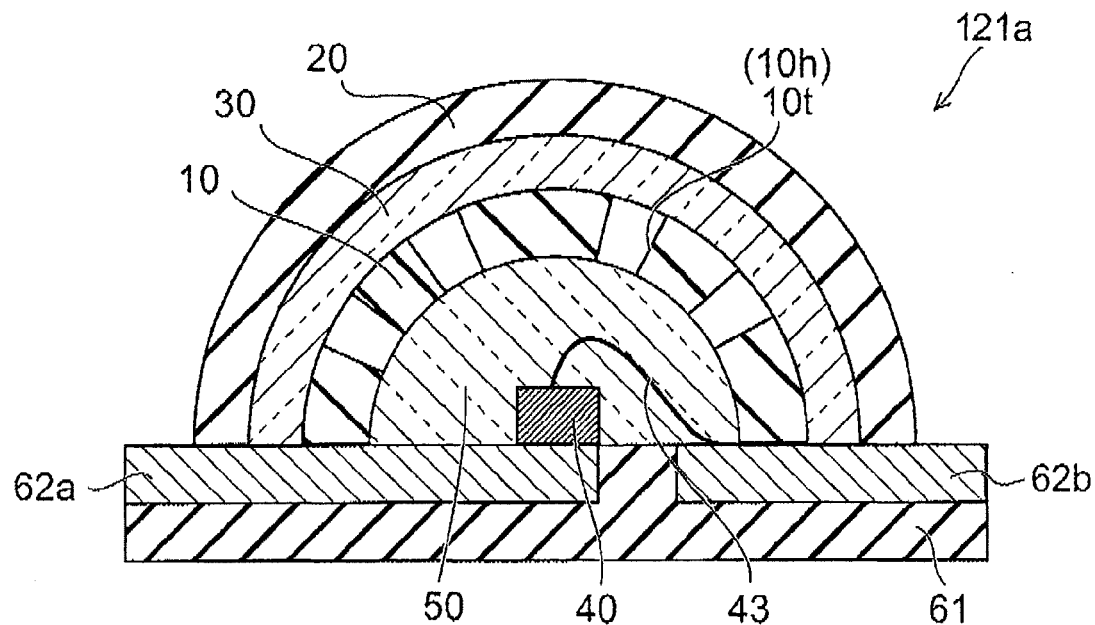
FIGS. 10A and 10B are schematic cross-sectional views illustrating the light emitting device.
Figure 10B:
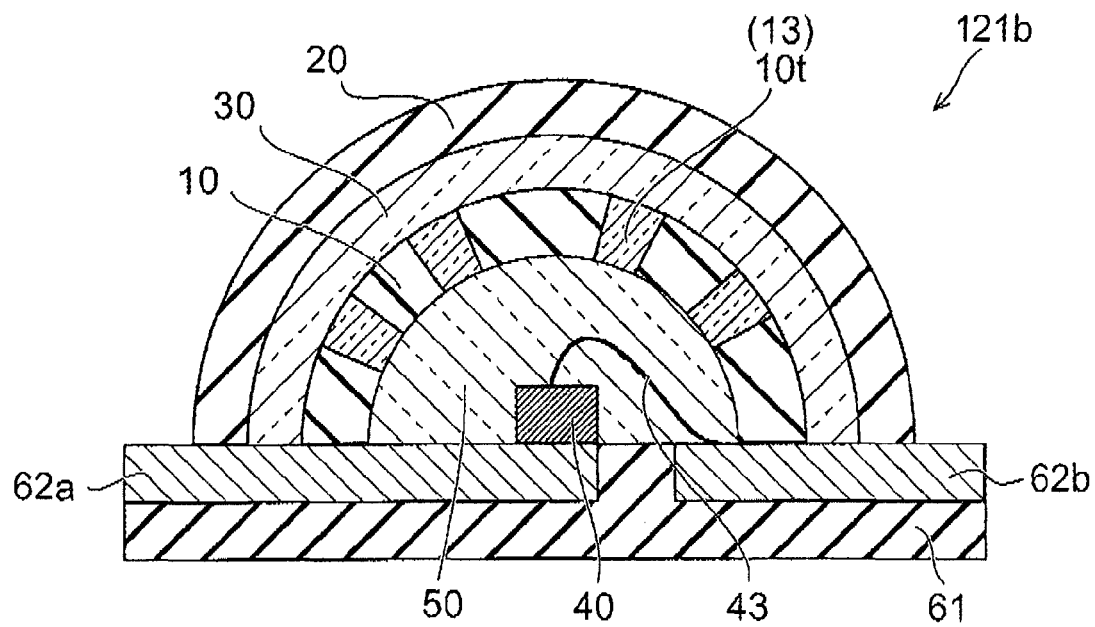

FIGS. 10A and 10B are schematic cross-sectional views illustrating the configurations of other light emitting devices according to the second embodiment of the invention.

As shown in FIG. 10A, in another light emitting device 121*a* according to this embodiment, the configuration of the light emitting device 113*a* illustrated in FIG. 8(*a*) is modified as follows: light transmitting regions lot are provided in the first wavelength conversion portion 10 instead of the holes 20*h* being provided in the second wavelength conversion portion 20. In this specific example, holes 10*h* are provided as the light transmitting regions lot in the first wavelength conversion portion 10. Other than these, the light emitting device 121*a* is the same as the light emitting device 113*a*, and a description will be omitted.

As shown in FIG. 10B, in another light emitting device 121b according to this embodiment, the configuration of the light emitting device 121a is modified as follows: resin layers 13 are used as the light transmitting regions 10t of the first wavelength conversion portion 10. The resin layers 13 contain no fluorescent material and are transparent layers having relatively higher transmittances than the region of the first wavelength conversion portion 10, which contains the first fluorescent material 10a. Other than these, the light emitting device 121b is the same as the light emitting device 121a, and a description is omitted.

Specifically, the first wavelength conversion portion 10 may have the holes 10h piercing the first wavelength conversion portion 10 in the direction of the thickness of the first wavelength conversion portion 10, and the light emitting device 121b may further include the resin layers 13, which are buried in the holes 10h and transmit the source light 41.

The above-described light emitting devices 121a and 121b also make it possible to suppress the energy loss of the source light 41, which occurs in the region of the first wavelength conversion portion 10 that contains the first fluorescent material 10a. Thus, a light emitting device, which emits light of desired color with high efficiency, can be provided.

The chromaticity of light emitted from the light emitting devices can also be adjusted by changing the areas, positions, sizes, number, and the like of the light transmitting regions 10t (at least one of the holes 10h and the resin layers 13).

As the light source 40 for use in the various light emitting devices according to the above-described first and second embodiments, a light source, which emits light having a wavelength capable of exciting at least fluorescent material, can be used.

The emission wavelength range of the light source 40 can be appropriately set in accordance with the wavelength regions where the first fluorescent material 10a for use in the first wavelength conversion portion 10 and the second fluorescent material 20a of the second wavelength conversion portion 20 are strongly excited, and the color, wavelength range, and the like of light generated from the light emitting device.

For example, in the case where white light is obtained from a light emitting device, it is possible to use a combination of the light source 40, which emits light having ultraviolet to violet wavelengths, and three types of fluorescent materials which emit blue light, green light, and red light, respectively, by being excited by the source light 41 emitted from the light source 40.

For example, in the case where white light is obtained from a light emitting device, it is also possible to use a combination of the light source 40, which emits light having a blue wavelength, and a fluorescent material which emits yellow light by being excited by the blue light.

For example, in the case where white light is obtained from a light emitting device, it is also possible to use a combination of the light source 40, which emits light having a blue wavelength, a fluorescent material which emits green light by being excited by the blue light, and a fluorescent material, which emits red light by being excited by the blue light.

Moreover, other various combinations can be used.

Examples of light sources that can be used as the light source 40 and obtain light of ultraviolet, near-ultraviolet, violet, blue-violet, blue, and the like include: burning light sources with flames of such colors; various discharge tubes (e.g., ones using mercury, argon, or an indium halide, and the like), which emit light of such colors; various inorganic ELs (e.g., ones using zinc sulfide, and the like), which emit light of such colors; various organic ELs (e.g., ones using a fluorene polymer, and the like), which emit light of such colors; a light source which extracts only light of wavelength regions of such colors from another light source using an optical slit, a lens, a color filter, or the like; light emitting semiconductor elements, which emit light of such colors; and the like.

Among these, light emitting semiconductor elements are preferably used as the light source 40 from the point of view of high energy efficiency.

Among light emitting semiconductor elements, it is preferable to use as the light source 40 an LED element or laser light emitting element, which uses a group III-V compound semiconductor, particularly $Al_xGa_yIn_{1-x-y}N$ as a light emitting layer and emits light of ultraviolet, near-ultraviolet, violet, blue-violet, or blue, since these have high energy efficiency. Specific examples of such elements are described in Japanese Patent No. 3182346 and Japanese Patent No. 3300657 and the like.

On the other hand, as the first fluorescent material 10a and the second fluorescent material 20a for use in the light emitting devices according to the first and second embodiments, it is possible to use fluorescent materials, which are excited by the source light 41 emitted from the light source 40 and may have any emission wavelengths and any physical properties. As described previously, the second fluorescent material 20a may be a fluorescent material, which is also excited by the first light 11 emitted by the first fluorescent material 10a.

In the case where the light source 40, which emits light of ultraviolet, near-ultraviolet, violet, blue-violet, or blue, is used to obtain white light or visible light as light emitted from a light emitting device, for example, the following fluorescent materials can be used as the first fluorescent material and the second fluorescent material 20a.

(1) Metal complexes, oxides, condensed oxides, nitrides, oxynitrides, sulfides, oxysulfides, halides, phosphides, selenides, and oxoacid salts (aluminates, silicates, vanadates, borates, phosphates, compounds obtained by substituting part of these for a halogen, composite salts thereof, and the like) containing a metal such as Ce, Dy, Gd, Eu, La, Pr, Sm, Tb, Tm, Al, Ba, Bi, Ca, Cd, Ga, Ge, Hg, In, Li, Mg, Na, Sb, Si, Sn, Sr, Tl, Zn, Ag, Cr, Cu, Ir, Mn, Pt, Ta, Ti, V, W, and Y, and composites thereof; and (2) Organic fluorescent pigments and organic dyes with hydrocarbon groups such as perylene, anthraquinone, lake, azo, quinacridone, anthracene, isoindoline, isoindolinone, phthalocyanine, triphenylmethane, indanthrone, indophenol, cyanine, dioxazine, condensed pyridine-phthalimide derivative, benzoxazole, benzoxazinone, quinazolinone, coumarin, quinophthalone, naphthalic acid imide, styryl, coumarin, pyrazoline, and triazole pigments or dyes, and composites thereof.

Specific examples are cited below. At least one or more elements among elements separated by commas "," need to be contained. The emission wavelength, absorptance, and quantum efficiency can be adjusted by selecting an element to be contained and, if two or more elements are contained, changing the composition ratio thereof. In the case of a particulate fluorescent material, the emission wavelength, absorptance, and quantum efficiency thereof can be adjusted by changing the particle size and surface shape thereof. In the case of a crystalline material, the emission wavelength, absorptance, and quantum efficiency thereof can be adjusted by changing the degree of defects thereof.

$(Ba, Eu, Sr)(Mg, Mn)Al_{10}O_{17}$
$(Ba, Ca, Mg, Sr)_{10}(PO_4)_6Cl_2:Eu$
$(Ba, Ca, Sr)SiO_4:Eu$
$(Ba, Ca, Mg, Sr)AlSiN_3:Eu$
$(Ba, Ca, Sr)_2Si_5N_8:Eu$ (Ba, Ca, Mg, Sr)$_5$(PO$_4$)$_3$Cl:Eu, Mn
(Ba, Sr)$_3$MgSi$_2$O$_8$:Eu, Mn
(Ca, Sr)(Al, Ga)$_2$S$_4$:Eu, Tb
(Ca, Mg, Sr)$_3$Sc$_2$Si$_3$O$_{12}$:Ce
(Ca, Mg, Sr)$_9$Si$_4$O$_{16}$Cl$_2$:Eu
(Y, Gd)$_3$(Al, Ga)$_5$O$_{12}$:Ce, Eu, Tb
(Y, La, Gd, Eu)$_2$(O, S)$_3$:Eu, Tb
(Y, Gd)BO$_3$:Ce, Eu
(Zn, Mn)$_2$SiO$_4$:Mn
(Mg, Zn, Cd)(O, S, Se)
(Zn, Cd)S:Ag, Cu, Al
(Al, Ga, In)(N, P, As)
BaAl$_{12}$O$_{19}$:Mn
BaMg$_2$Al$_{16}$O$_{27}$:Eu
LaPO$_4$:Ce, Tb
LiEuW$_2$O$_8$
SiAl$_2$O$_2$N$_2$:Eu
Y$_2$SiO$_5$:Tb
YVO$_4$:Eu

Other than these, fluorescent materials and the like can be cited in which a rare-earth metal is activated as a luminescent center element in a base material represented by the composition formula (Sr$_x$Ca$_y$Ba$_z$)$_a$Si$_b$Al$_c$O$_d$N$_e$ (where x+y+z=1, 2a+4b+3c=2d+3e).

The first wavelength conversion portion 10 and the second wavelength conversion portion 20 may contain any of the above-described fluorescent materials mixed with a ceramic such as SiO$_2$, Al$_2$O$_3$, In$_2$O$_3$, SnO$_2$, TiO$_2$, ZnO, ZrO$_2$, or AlN or a composite thereof (e.g., Al$_a$Si$_b$N$_c$O$_d$, In$_x$Sn$_y$O$_z$, or the like) for the sake of improving the photoreflectance, excitation light absorptance, unevenness in the color and luminance of emitted light, heat dissipation, and the like.

The light transmitting portion 30 may be an air layer, light transmissive glass material, silicone resin, or the like. Further, as already described, the light transmitting portion 30 may include the supports 32 for supporting the second wavelength conversion portion 20. As the supports 32, for example, various resins such as silicone resin can be used.

Third Embodiment

Hereinafter, an example of a method for manufacturing a light emitting device according to an embodiment of the invention will be described.

Specifically, the following manufacturing method is a method for manufacturing a light emitting device including: a light source 40 for emitting source light 41; a first wavelength conversion portion 10, which absorbs the source light 41 to emit first light 11 having a wavelength different from a wavelength of the source light 41; a light transmitting portion 30, which is provided at the opposite side of the first wavelength conversion portion 10 from the light source 40 and transmits the source light 41 and the first light 11; and a second wavelength conversion portion 20, which is provided at the opposite side of the light transmitting portion 30 from the first wavelength conversion portion 10 and absorbs at least one of the source light 41 and the first light 11 to emit second light 21 having a wavelength different from the wavelength of the source light 41 and also different from the wavelength of the first light 11.

Figure 11:
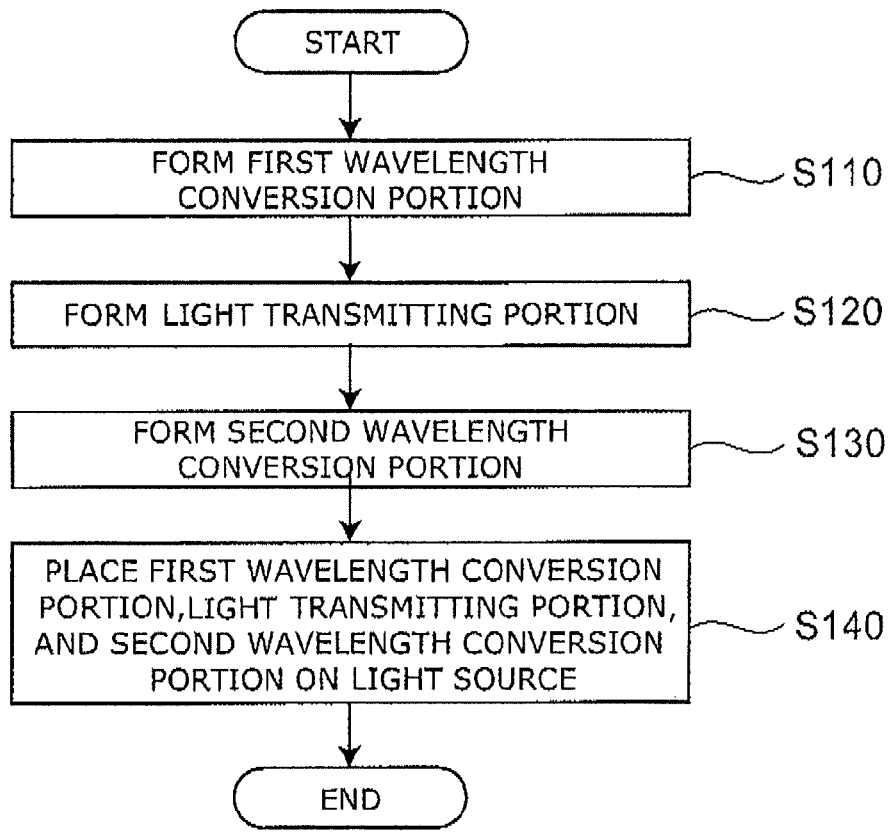
FIG. 11 is a flowchart illustrating a method for manufacturing a light emitting device.

FIG. 11 is a flowchart illustrating a method for manufacturing a light emitting device according to a third embodiment of the invention.

As shown in FIG. 11, the manufacturing method according to this embodiment includes processes of forming the first wavelength conversion portion 10, the light transmitting portion 30 facing the first wavelength conversion portion 10, and the second wavelength conversion portion 20 facing the light transmitting portion 30.

Specifically, this manufacturing method includes, for example, a process of forming the first wavelength conversion portion 10 (step S110), a process of forming the light transmitting portion 30 (step S120), and a process of forming the second wavelength conversion portion 20 (step S130).

Here, the above-described sequence of steps S110 to S130 can be changed when technically feasible, and several processes may be carried out at the same time.

For example, the following may be employed: first, the first wavelength conversion portion 10 is formed (step S110), the light transmitting portion 30 is formed on the first wavelength conversion portion 10 (step S120), and the second wavelength conversion portion 20 is formed on the light transmitting portion 30 (step S130).

Further, at least one of the following is employed: the above-described formation of the second wavelength conversion portion 20 (step S130) is performed so that part of the light transmitting portion 30 is covered and that other part of the light transmitting portion 30 is exposed; and the formation of the first wavelength conversion portion 10 (step S110) is performed so that the light transmitting regions 10$t$, which transmit the source light 41, are formed in the first wavelength conversion portion 10.

Then, for example, the laminated structure of the first wavelength conversion portion 10, the light transmitting portion 30, and the second wavelength conversion portion 20 is placed on the source light 40 (step S140).

The above-described sequence of steps S110 to S140 can be changed when technically feasible and that several processes may be carried out at the same time.

For example, in the case where the formation of the second wavelength conversion portion 20 (step S130) is performed so that part of the light transmitting portion 30 is covered and that other part of the light transmitting portion 30 is exposed, for example, the following may be employed: after the first wavelength conversion portion 10 is formed, the supports 32, which become part of the light transmitting portion 30, are formed on the first wavelength conversion portion 10, and the second wavelength conversion portion 20 is stacked thereon. In this case, the second wavelength conversion portion 20 is formed so that, for example, side surfaces of the light transmitting portion 30 are exposed. Alternatively, the following may be employed: the above-described supports 32 are provided on the second wavelength conversion portion 20, and the first wavelength conversion portion 10 is stacked thereon. By this, for example, the light emitting device 110$a$ illustrated in FIG. 3 can be fabricated.

Further, in the case where a second wavelength conversion portion 20 having the holes 20$h$ therein is formed as the second wavelength conversion portion 20 in step S130, it is possible to fabricate, for example, the light emitting device 112 illustrated in FIG. 7, the light emitting device 113$a$ illustrated in FIG. 8A, and the like. In the formation of the holes 20$h$, any technique may be employed, e.g., a method using a mold having protrusions, a needle, or the like, or laser machining or the like.

Moreover, in the case where a light transmitting portion 30 made of, for example, a transparent resin is formed in step S120, the formation of the supports 32 can be omitted. For example, in step S130, the second wavelength conversion portion 20 can be formed so that, for example, the side surfaces 30$s$ of the light transmitting portion 30 and part of the main surface 30$m$ thereof are not covered with the second wavelength conversion portion 20.

On the other hand, in the case where the formation of the first wavelength conversion portion 10 (step S110) is performed so that the light transmitting regions 10t are formed in the first wavelength conversion portion 10 and where the light transmitting regions 10t are, for example, the holes 10h, a method of forming openings as the holes 10h by any technique such as a method using a mold having protrusions, a needle, or the like, or laser machining can be applied to a layer to be the first wavelength conversion portion 10, for example.

In the case where the formation of the first wavelength conversion portion 10 (step S110) is performed so that the light transmitting regions 10t are formed in the first wavelength conversion portion 10 and where the light transmitting regions lot are, for example, the resin layers 13, a method can be employed in which a resin obtained by mixing layers to be the resin layers 13 with a layer including the first fluorescent material 10a dispersed therein is molded into the form of, for example, a sheet or dome.

In the case where at least one of the formation of the holes 20h in the second wavelength conversion portion 20 and the formation of the holes 10h in the first wavelength conversion portion 10 is performed as described above, conditions for at least one of the formation of the holes 20h in the second wavelength conversion portion 20 and the formation of the holes 10h in the first wavelength conversion portion 10 can be set, for example, based on at least one of: a result of measuring optical properties of at least one of the first wavelength conversion portion 10, the light transmitting portion 30, and the second wavelength conversion portion 20; a result of measuring optical properties of the source light 41 from the light source 40; and a result of measuring optical properties of the source light 41 from the first wavelength conversion portion 10, the light transmitting portion 30, the second wavelength conversion portion 20, and the light source 40.

For example, conditions for the holes 20h and the light transmitting regions 10t can be adjusted so that optical properties of the laminated structure of the first wavelength conversion portion 10, the light transmitting portion 30, and the second wavelength conversion portion 20 may fall within the range of predetermined specifications.

As already described, the chromaticity of light emitted from a light emitting device can be adjusted by changing the areas, positions, sizes, number, and the like of the holes 20h of the second wavelength conversion portion 20 and the light transmitting regions 10t (at least one of the holes 10h and the resin layers 13) of the first wavelength conversion portion 10. Accordingly, in the case where emission properties are different among individual light sources 40, the source light 41 of each individual light source 40 is measured. Then, the conditions for the holes 20h and the light transmitting regions 10t can be adjusted so that the variation in the measured source light 41 may be compensated.

Further, for example, the following can be performed: with the laminated structure of the first wavelength conversion portion 10, the light transmitting portion 30, and the second wavelength conversion portion 20 combined with the light source 40, properties of light emitted from the light emitting device are measured; and, based on a result of the measurement, the conditions for the holes 20h and the light transmitting regions 10t are adjusted so that properties of light emitted from the light emitting device may fall within the range of predetermined specifications.

For example, there are cases where variations in the emission wavelengths and outputs of LEDs used as light sources 40, variations in the amounts and dispersed states of fluorescent materials, and the like cause a color shift in, for example, white light obtained from a light emitting device to reduce product yield. However, as described above, the configuration and manufacturing method of the embodiment of the invention make it possible to finely adjust a color shift after a light emitting device is assembled once. Further, it is also possible to improve the manufacturing yield of the light emitting device.

Figure 12:
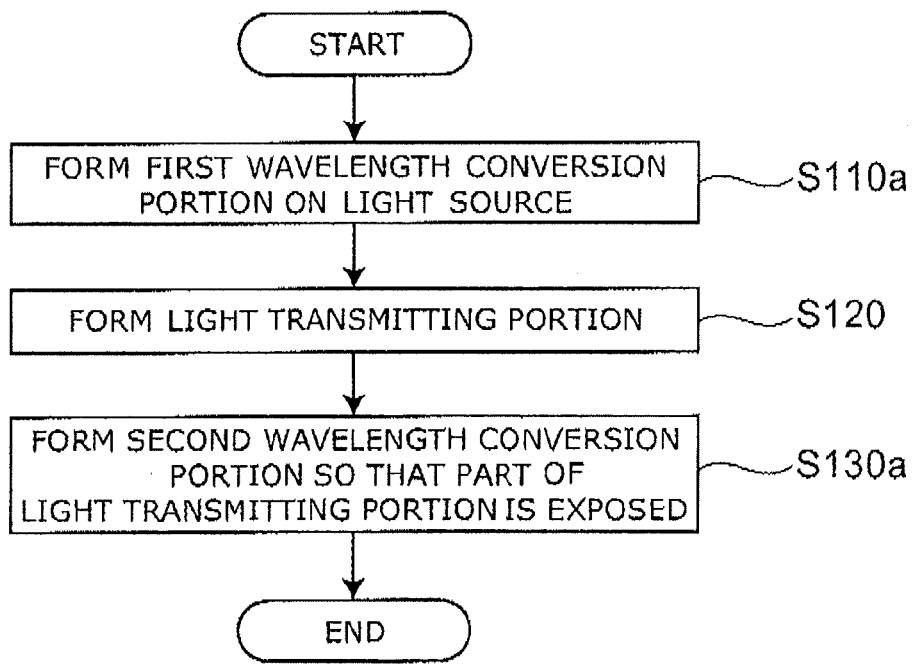
FIG. 12 is a flowchart illustrating a method for manufacturing a light emitting device.

FIG. 12 is a flowchart illustrating another method for manufacturing a light emitting device according to the third embodiment of the invention.

As shown in FIG. 12, in another manufacturing method according to this embodiment, in step S110a in which the first wavelength conversion portion 10 is formed, the first wavelength conversion portion 10 is formed on the light source 40.

At this time, step S110a may include a process of forming the light transmitting regions 10t, which transmit the source light 41, in the first wavelength conversion portion 10.

Then, for example, the light transmitting portion 30 is formed on the first wavelength conversion portion 10 (step 5120).

Thereafter, the second wavelength conversion portion 20 is formed on the light transmitting portion 30 (step S130a). At this time, step S130a may be performed so that part of the light transmitting portion 30 is covered and that other part of the light transmitting portion 30 is exposed.

Figure 13:
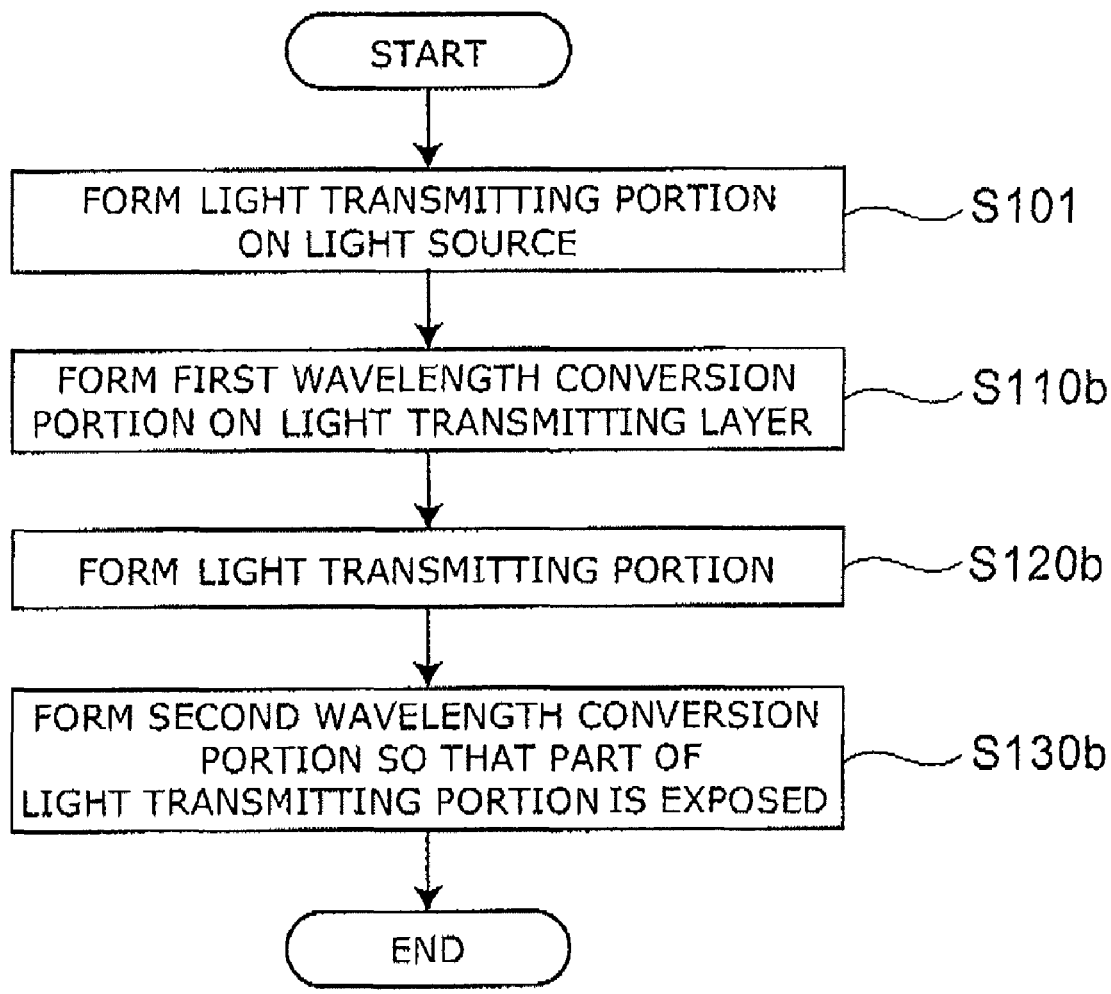
FIG. 13 is a flowchart illustrating a method for manufacturing a light emitting device.

FIG. 13 is a flowchart illustrating another method for manufacturing a light emitting device according to the third embodiment of the invention.

As shown in FIG. 13, in another manufacturing method according to this embodiment, first, the light transmitting layer 50 is formed on the light source 40 (step S101).

Then, the first wavelength conversion portion 10 is formed on the light transmitting layer 50 (step S110b). The light transmitting portion 30 is formed on the first wavelength conversion portion 10 (step S120b). The second wavelength conversion portion 20 is formed on the light transmitting portion 30 so that part of the light transmitting portion 30 is covered and that other part of the light transmitting portion 30 is exposed (step S130b).

As described above, a method can be employed in which the light transmitting layer 50, the first wavelength conversion portion 10, the light transmitting portion 30, and the second wavelength conversion portion 20 are formed in order on the light source 40.

For example, the following method can be employed: the first wavelength conversion portion 10 in the form of a flat plate and the second wavelength conversion portion 20 in the form of a flat plate are fabricated in advance, the first wavelength conversion portion 10 is placed on the light source 40, a spacer is placed on the first wavelength conversion portion 10, and then the second wavelength conversion portion 20 is placed on the spacer. An air layer is formed by this spacer and serves as the light transmitting portion 30. Further, an air layer between the light source 40 and the first wavelength conversion portion 10 serves as the light transmitting layer 50. In this case, steps S101 and S110b are carried out at the same time, and steps S120b and S130b are carried out at the same time. In step S101, the light transmitting layer 50 made of a transparent resin may be placed on the light source 40.

Further, for example, the following method can be employed: the first wavelength conversion portion 10 having a domal shape and the second wavelength conversion portion 20 having the holes 20h in part thereof and having a domal shape with a diameter larger than a diameter of the first wavelength conversion portion 10 are fabricated in advance, the first wavelength conversion portion 10 is overlaid on the light source, and the second wavelength conversion portion 20 is overlaid on the first wavelength conversion portion 10.

In this case, by overlaying the first wavelength conversion portion 10 on the light source 40, the light transmitting layer 50 made of an air layer is formed between the light source 40 and the first wavelength conversion portion 10. Further, by overlaying the second wavelength conversion portion 20 on the first wavelength conversion portion 10, the light transmitting portion 30 made of an air layer can be formed between the first wavelength conversion portion 10 and the second wavelength conversion portion 20. In this case, steps S101 and S110b are carried out at the same time. Further, steps S120b and S130b are carried out at the same time.

Figure 14:
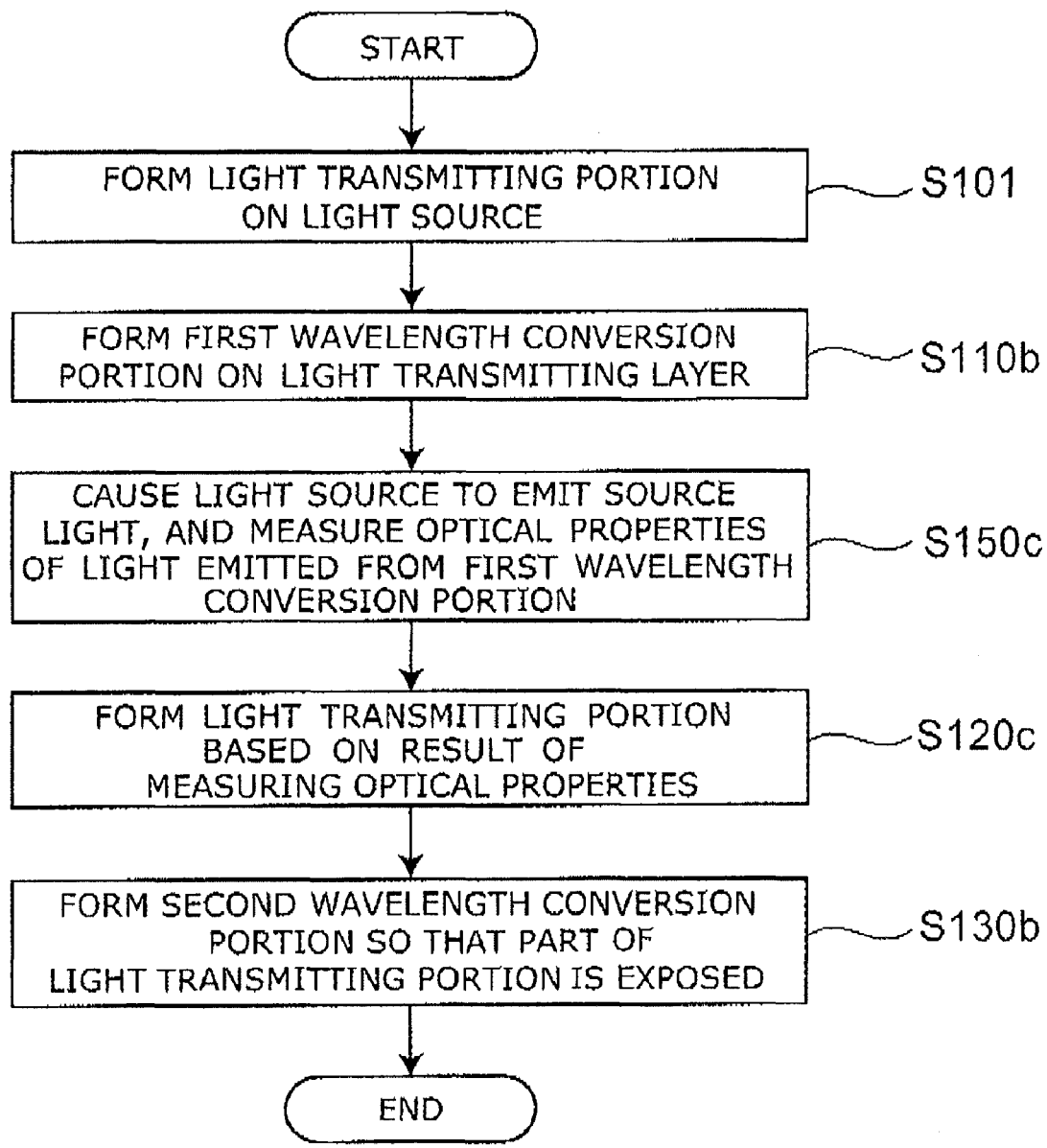
FIG. 14 is a flowchart illustrating a method for manufacturing a light emitting device.

FIG. 14 is a flowchart illustrating another method for manufacturing a light emitting device according to the third embodiment of the invention.

As shown in FIG. 14, after step S110b in which the first wavelength conversion portion 10 is placed and formed on the light transmitting layer 50, the light source 40 is caused to emit the source light 41, and a measurement is made of optical properties, e.g., the spectrum, of light emitted from the first wavelength conversion portion 10 (step S150c).

Then, based on a result of this measurement of the optical properties, the light transmitting portion 30 is formed (step S120c).

Thereafter, the second wavelength conversion portion 20 is formed so that part of the light transmitting portion 30 is covered and that other part of the light transmitting portion 30 is exposed (step S130b).

Specifically, for example, the first wavelength conversion portion 10 in the form of a flat plate and the second wavelength conversion portion 20 in the form of a flat plate are fabricated in advance. The first wavelength conversion portion 10 is placed on the light source. Then, in this state, the light source 40 is caused to emit the source light 41, and a measurement is made of the spectrum of light emitted from the first wavelength conversion portion 10. Based on the result, the size (thickness) and the like of a spacer are determined, and the second wavelength conversion portion 20 is placed on the spacer. Thus, for example, the thickness of the light transmitting portion 30 is determined based on the result of measuring the optical properties. Accordingly, light emitted from the light emitting device can be adjusted to the range of predetermined specifications with high accuracy.

Figure 15:
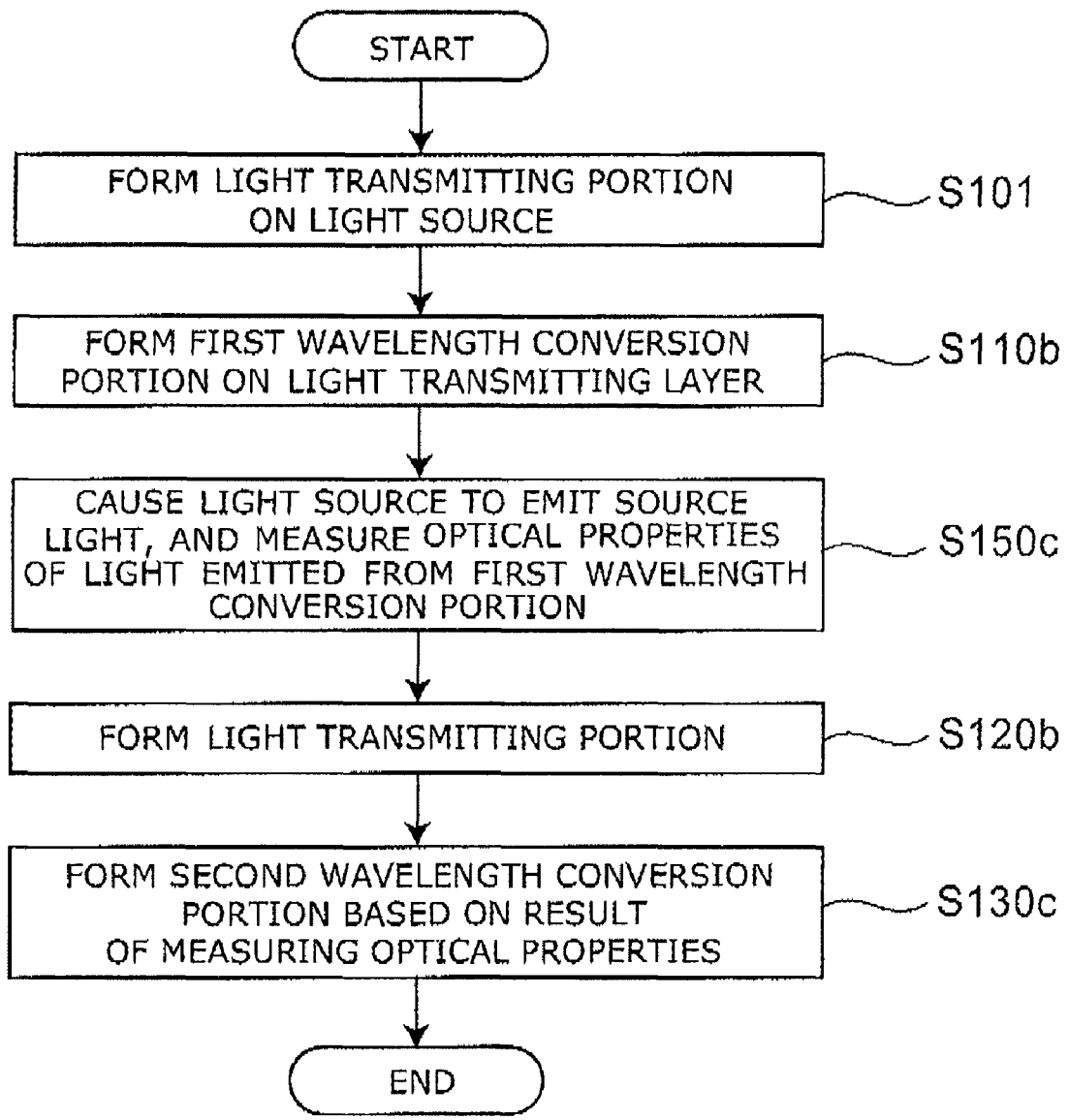
FIG. 15 is a flowchart illustrating a method for manufacturing a light emitting device.

FIG. 15 is a flowchart illustrating another method for manufacturing a light emitting device according to the third embodiment of the invention.

As shown in FIG. 15, after step S110b in which the first wavelength conversion portion 10 is placed and formed on the light transmitting layer 50, the light source 40 is caused to emit the source light 41, a measurement is made of optical properties, e.g., the spectrum, of light emitted from the first wavelength conversion portion 10 (step S150c). For example, a spacer is placed on the first wavelength conversion portion 10, and the second wavelength conversion portion 20 is placed and formed on the spacer (steps S120b and S130c).

At this time, based on a result of measuring the optical properties, for example, the type of the second wavelength conversion portion 20 is selected. Here, the type of the second wavelength conversion portion 20 includes properties of the second fluorescent material 20a such as the efficiency, emission wavelength, absorptance, quantum efficiency, particle size, and the like of the fluorescent material, the dispersed form and concentration of the second fluorescent material 20a in the second wavelength conversion portion 20, and the size and thickness of the second wavelength conversion portion 20, and the like. In other words, by changing the type of the second wavelength conversion portion 20, properties of light, which passes through the second wavelength conversion portion 20, and properties of the second light 21 generated from the second wavelength conversion portion 20 can be changed.

Specifically, based on the result of measuring the optical properties, for example, variations in properties of the light source 40 and the first wavelength conversion portion 10 and deviation from a target are grasped to adjust properties of the second wavelength conversion portion 20 so that such deviation may be eliminated. This can reduce the variation in the chromaticity of the light emitting device.

Moreover, based on the result of measuring the optical properties, for example, the size, density, and the like of the holes 20h to be provided in the second wavelength conversion portion 20 are set. Then, the holes 20h are formed in the second wavelength conversion portion 20, and the second wavelength conversion portion 20 is placed on the spacer. Alternatively, different types of second wavelength conversion portions 20 in which the holes 20h are provided in accordance with different specifications are prepared beforehand, and the size, density, and the like of the holes 20h are selected based on the result of measuring the optical properties.

Alternatively, after the second wavelength conversion portion 20 is placed on the spacer, the holes 20h may be formed in the second wavelength conversion portion 20 by laser machining or the like. The size and density of these holes 20h are set based on the result of measuring the optical properties.

Both step S120c described in relation to FIG. 14 and step S130c described in relation to FIG. 15 may be carried out in combination.

In other words, properties of at least one of the light transmitting portion 30 and the second wavelength conversion portion 20 can be adjusted based on the result of measuring the optical properties.

Figure 16:
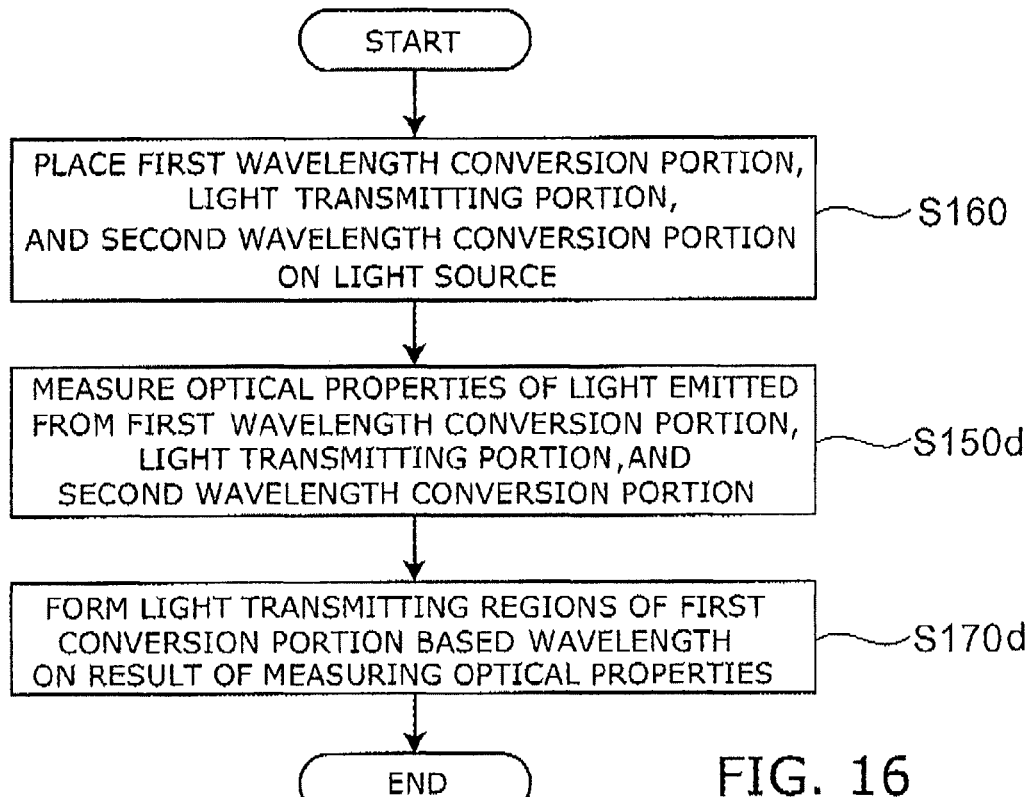
FIG. 16 is a flowchart illustrating a method for manufacturing a light emitting device.

FIG. 16 is a flowchart illustrating another method for manufacturing a light emitting device according to the third embodiment of the invention.

As shown in FIG. 16, first, the first wavelength conversion portion 10, the light transmitting portion 30, and the second wavelength conversion portion 20 are placed on the light source 40 (step S160).

Then, with the light source 40 caused to emit the source light 41, a measurement is made of optical properties, e.g., the spectrum, of light emitted from the laminated structure of the first wavelength conversion portion 10, the light transmitting portion 30, and the second wavelength conversion portion 20 (step S150d).

Thereafter, based on a result of measuring the optical properties, the light transmitting regions 10t of the first wavelength conversion portion 10 are formed (step S170d). Specifically, the holes 10h are formed as the light transmitting regions 10t in the first wavelength conversion portion 10 by laser machining or the like. After the size, density, and the like of the holes 10h at this time are set based on the result of measuring the optical properties, the holes 10h are formed.

Figure 17:
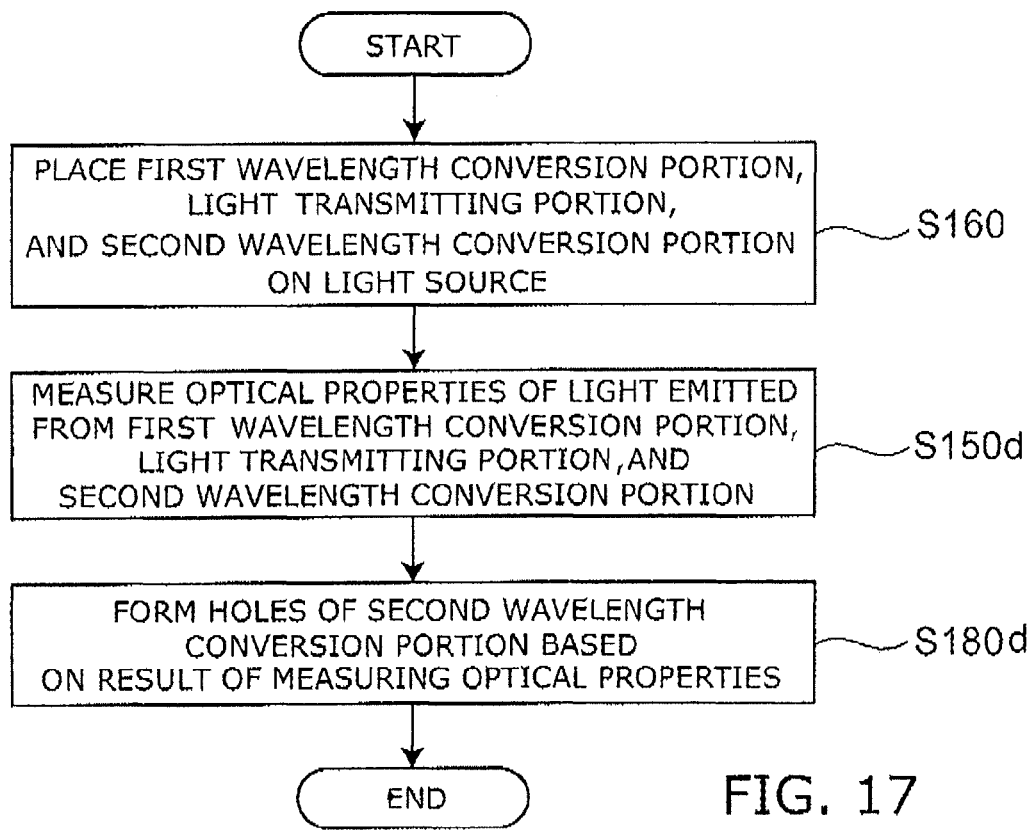
FIG. 17 is a flowchart illustrating a method for manufacturing a light emitting device.

FIG. 17 is a flowchart illustrating another method for manufacturing a light emitting device according to the third embodiment of the invention.

As shown in FIG. 17, after step S150d in which a measurement is made of optical properties of light emitted from the laminated structure of the first wavelength conversion portion 10, the light transmitting portion 30, and the second wavelength conversion portion 20, the holes 20h are formed in the second wavelength conversion portion 20 based on a result of measuring the optical properties (step S180d). Specifically, after the size, density, and the like of the holes 20h are set based on the result of measuring the optical properties, the holes 20h are formed.

Figure 18:
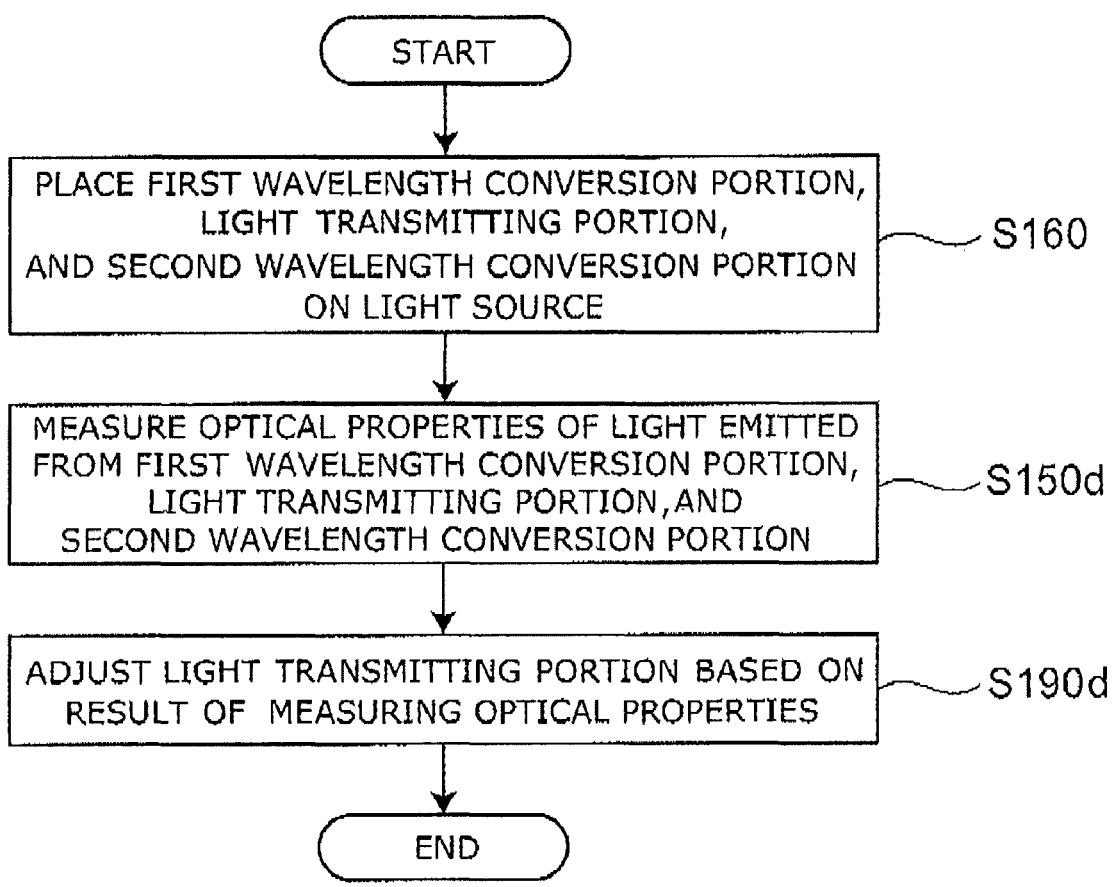
FIG. 18 is a flowchart illustrating a method for manufacturing a light emitting device.

FIG. 18 is a flowchart illustrating another method for manufacturing a light emitting device according to the third embodiment of the invention.

As shown in FIG. 18, after step S150d in which a measurement is made of optical properties of light emitted from the laminated structure of the first wavelength conversion portion 10, the light transmitting portion 30, and the second wavelength conversion portion 20, the light transmitting portion 30 is formed based on a result of measuring the optical properties (step S190d).

For example, the following method can be employed: after the optical properties are measured, the second wavelength conversion portion 20 is removed once, an adjustment is made of, for example, the size of a spacer based on the result of measuring the optical properties, and then the second wavelength conversion portion 20 is placed on the spacer again.

As described above, a measurement is made of optical properties of light, which has passed through the first wavelength conversion portion 10 or all of the first wavelength conversion portion 10, the light transmitting portion 30, and the second wavelength conversion portion 20. Based on a result of the measurement, an adjustment is made of specifications of at least one of the first wavelength conversion portion 10, the light transmitting portion 30, and the second wavelength conversion portion 20. Accordingly, optical properties of light emitted from the light emitting device can fall within the range of predetermined specifications with high accuracy, and the yield is also improved.

As described above, in the methods for manufacturing a light emitting device according to the embodiment of the invention, the process of forming the light transmitting regions lot of the first wavelength conversion portion 10 and the process of forming the holes 20h in the second wavelength conversion portion 20 can be performed at any manufacturing stages. For example, a method may be employed in which the first wavelength conversion portion 10 having the light transmitting regions 10t provided therein and the second wavelength conversion portion 20 having the holes 20h provided therein are formed beforehand and then combined.

Alternatively, for example, at an intermediate stage or the last stage of the light emitting device manufacturing process, the light transmitting regions 10t and the holes 20h may be formed to adjust the chromaticity.

EXAMPLES

In light emitting devices according to Examples, a light emitting element, which emits blue light, more specifically, a GaN-based light emitting semiconductor element, which emits light having a peak wavelength of 450 nm and having wavelengths approximately within the range of 410 to 500 nm, was used as the light source 40. Further, a particulate fluorescent material $(Ba, Ca, Sr)_2SiO_4$:Eu, which emits green light, was used as the first fluorescent material 10a of the first wavelength conversion portion 10, and a particulate fluorescent material $CaSiN_3$:Eu, which emits red light, was used as the second fluorescent material 20a of the second wavelength conversion portion 20.

In other words, the source light 41 is blue, the first light 11 is green, and the second light 21 is red.

In the package 60 in which the light source 40 was mounted, the light source 40 was encapsulated by KER2500 (manufactured by Shin-Etsu Chemical Co., Ltd.), which is a resin for encapsulating LEDs. This encapsulating resin served as the light transmitting layer 50.

Subsequently, the first wavelength conversion portion 10 including the above-described encapsulating resin and the first fluorescent material 10a dispersed in the encapsulating resin is mounted on the package 60. Then, a resin frame (spacer) having a predetermined thickness was mounted on the first wavelength conversion portion 10. Further, the second wavelength conversion portion 20 including the above-described encapsulating resin and the second fluorescent material 20a dispersed in the encapsulating resin was mounted on the resin frame.

Thus, the gap 32g was formed from the resin frame between the first wavelength conversion portion 10 and the second wavelength conversion portion 20. The portion of the gap 32g served as the light transmitting portion 30. The side surfaces 30s of the light transmitting portion 30 were not covered with the second wavelength conversion portion 20.

In this respect, as the resin frame, three types of resin frames having thicknesses of 50 µm, 100 µm, and 150 µm were used. The light emitting devices are referred to as light emitting devices 201, 202, and 203, respectively. In other words, in the light emitting devices 201, 202, and 203, the thickness of the light transmitting portions 30 are 50 µm, 100 µm, and 150 µm, respectively.

On the other hand, as a comparative example, a light emitting device 199 (not shown) was fabricated in which the second wavelength conversion portion 20 was mounted directly on the first wavelength conversion portion 10 without a resin frame.

Figures 19A, 19B:
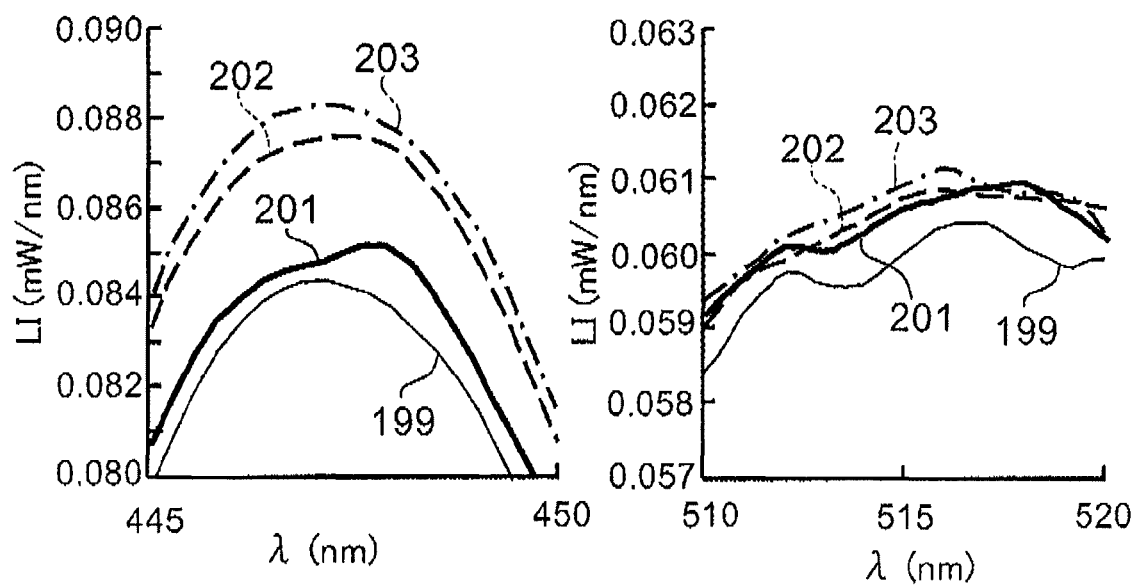
FIGS. 19A to 19C are graphs illustrating the properties of light emitting devices.
Figure 19C:
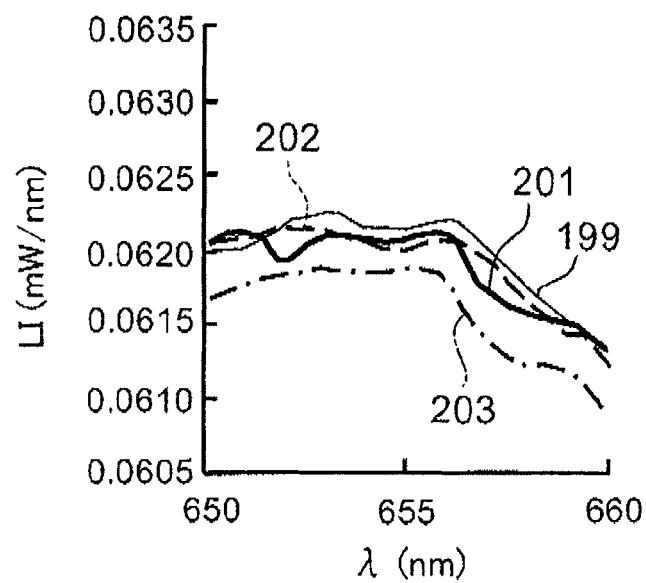

FIGS. 19A to 19C are graphs illustrating the properties of light emitting devices according to examples of the invention and a light emitting device of a comparative example.

Specifically, these drawings illustrating the properties of light emitted from the light emitting devices 201 to 203 according to the examples and the light emitting device 199 of the comparative example. FIGS. 19A to 19C show blue, green, and red components, respectively. In these drawings, the horizontal axis represents the wavelength λ (nm), and the vertical axis represents the light intensity LI (mW/nm).

As shown in FIG. 19A, in the light emitting devices 201 to 203 according to the examples, the light intensities LI of the blue components were increased compared to the light emitting device 199 of the comparative example. Thus, the luminous efficiencies were improved.

Further, as shown in FIG. 19B, in the light emitting devices 201 to 203 according to the examples, the light intensities LI of the green components were increased compared to the light emitting device 199 of the comparative example. Thus, the luminous efficiencies were improved.

Moreover, as shown in FIG. 19C, in the light emitting devices 201 and 202, the light intensities LI of the red components were approximately equal to that in the light emitting device 199. In the light emitting device 203, the light intensity LI of the red component was slightly reduced compared to the light emitting device 199, but the degree of reduction was very small.

As described above, in the light emitting devices 201 to 203 of the examples, providing the light transmitting portion 30 increased the source light 41 containing blue components and the first light 11 containing green components, and improved the luminous efficiencies. Further, as the thickness of the light transmitting portion 30 increased from 50 µm to 150 µm, the degrees of increase of the source light 41 and the first light 11 increased.

Moreover, the spectrum of light emitted from the light emitting device 203 was measured.

Then, the holes 20h were formed in the second wavelength conversion portion 20 of the light emitting device 203 using a needle. This light emitting device is referred to as a light emitting device 204. The spectrum of light emitted from the light emitting device 204 was measured.

Thereafter, the sizes of the holes 20h in the second wavelength conversion portion 20 of the light emitting device 204 were increased. This light emitting device is referred to as a light emitting device 205. The spectrum of light emitted from the light emitting device 205 was measured.

Then, chromaticity was found from results of measuring these spectra

Figure 20:
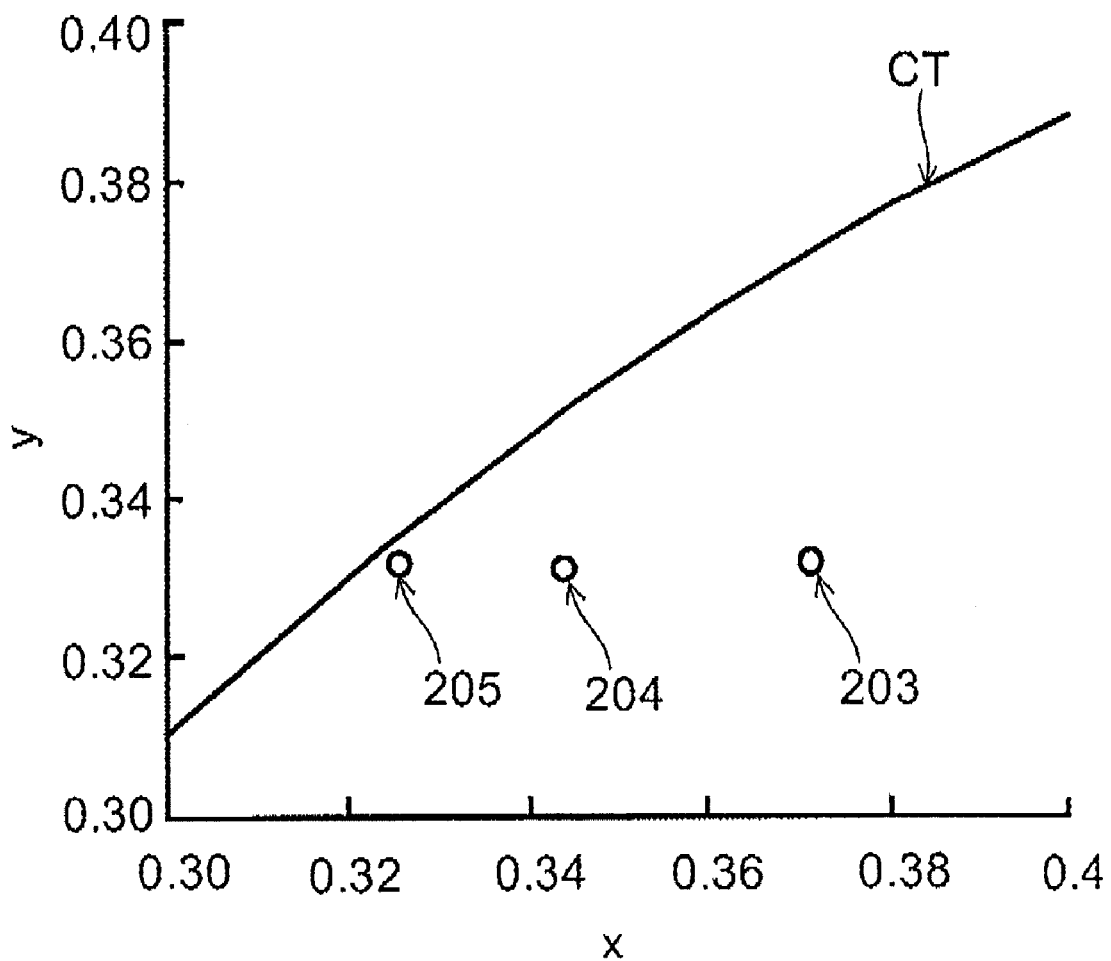
FIG. 20 is a graph illustrating the chromaticity of the light emitting devices.

FIG. 20 is a graph illustrating the chromaticity of the light emitting devices according to the examples of the invention.

In other words, this drawing is a CIE chromaticity diagram. In this drawing, a curve of color temperature CT is shown.

As shown in FIG. 20, the chromaticity shifted toward blue-green in the following order: the light emitting devices 203, 204, and 205. In other words, the chromaticity shifted toward blue-green with increasing size of the holes 20h.

This seems to be resulted from that the area of the second wavelength conversion portion 20 was relatively reduced by the formation of the holes 20h in the second wavelength conversion portion 20 emitting red light and that the blue light of the light source 41 and the green light of the first light 11 were relatively increased by the formation of the holes 20h.

As described above, the chromaticity of light emitted from a light emitting device already manufactured can be adjusted by providing the holes 20h in the second wavelength conversion portion 20. Further, the chromaticity of light to be emitted can be further adjusted by changing the sizes of the holes 20h.

Embodiments of the invention have been described above with reference to specific examples. However, the invention is not limited to these specific examples. For example, specific configurations of components of a light emitting device, such as a light source, a first wavelength conversion portion, a second wavelength conversion portion, a light transmitting portion, supports, light transmitting regions, a substrate, and a package, can be appropriately selected within a range known by those skilled in the art and are included in the scope of the invention as long as the invention can be similarly carried out to obtain similar effects.

Moreover, combinations of two or more components in the specific examples within a technically feasible range are also included in the scope of the invention as long as the spirit of the invention is included.

In addition, any light emitting devices, which those skilled in the art can carry out by making appropriate design modifications based on the light emitting devices described above as the embodiments of the invention, are also in the scope of the invention as long as the spirit of the invention is included.

Also, within the scope of principles of the invention, various changes and modifications will be readily made by those skilled in the art. Accordingly, it will be appreciated that such changes and modifications also fall within the scope of the invention.

The invention claimed is:

1. A light emitting device, comprising:
a light source to emit source light;
a first wavelength conversion portion to absorb the source light and to emit first light having a wavelength different from a wavelength of the source light;
a light transmitting portion provided at an opposite side of the first wavelength conversion portion from the light source and configured to transmit the source light and the first light; and
a second wavelength conversion portion provided at an opposite side of the light transmitting portion from the first wavelength conversion portion and configured to absorb at least one of the source light and the first light to emit second light having a wavelength different from the wavelength of the source light and also different from a wavelength of the first light,
part of the source light being configured to be taken to an outside of the light emitting device without passing through at least one of the first wavelength conversion portion and the second wavelength conversion portion.

2. The light emitting device according to claim 1, wherein the light transmitting portion includes a first region covered with the second wavelength conversion portion and a second region not covered with the second wavelength conversion portion,
the second region including at least one of a part of a main surface of the light transmitting portion facing the second wavelength conversion portion and at least a part of a side surface of the light transmitting portion.

3. The light emitting device according to claim 2, wherein the first wavelength conversion portion includes a third region covered with the second wavelength conversion portion and a fourth region not covered with the second wavelength conversion portion,
the fourth region including at least one of a part of a main surface of the first wavelength conversion portion facing the light transmitting portion and at least a part of a side surface of the first wavelength conversion portion.

4. The light emitting device according to claim 1, wherein the light transmitting portion is provided to be in contact with a part of the first wavelength conversion portion and a part of the second wavelength conversion portion and includes a support supporting the second wavelength conversion portion, and
a gap is provided in a portion excluding the support between the first wavelength conversion portion and the second wavelength conversion portion.

5. The light emitting device according to claim 1, wherein the first wavelength conversion portion includes a first hole piercing the first wavelength conversion portion in a direction of a thickness of the first wavelength conversion portion.

6. The light emitting device according to claim 5, wherein the first wavelength conversion portion includes a resin buried in the first hole and transmits the source light.

7. The light emitting device according to claim 1, wherein the second wavelength conversion portion includes a second hole piercing the second wavelength conversion portion in a direction of a thickness of the second wavelength conversion portion.

8. The light emitting device according to claim 7, wherein the second wavelength conversion portion includes a resin layer buried in the second hole.

9. The light emitting device according to claim 1, wherein each of the first wavelength conversion portion, the light transmitting portion, and the second wavelength conversion portion is in a flat-plate form.

10. The light emitting device according to claim 1, wherein the wavelength of the first light is longer than the wavelength of the source light, and
the wavelength of the second light is longer than the wavelength of the first light.

11. The light emitting device according to claim 1, wherein the first wavelength conversion portion has a domed shape, the light transmitting portion has a domed shape and is disposed outside the first wavelength conversion portion, and the second wavelength conversion portion has a domed shape and is disposed outside the light transmitting portion.

12. The light emitting device according to claim 1, wherein the first wavelength conversion portion includes a first resin layer and a first fluorescent material dispersed in the first resin layer, and the second wavelength conversion portion includes a second resin layer and a second fluorescent material dispersed in the second resin layer.

13. The light emitting device according to claim 1, wherein the light transmitting portion includes at least one of an air layer, light transmissive glass material, a resin.

14. The light emitting device according to claim 1, further comprising a light transmitting layer provided between the light source and the first wavelength conversion portion, the light transmitting layer including at least one of a resin layer, a gas layer of air, a gas layer of nitrogen and a vacuum layer.

15. The light emitting device according to claim 1, further comprising a base body, at least one of a periphery of the first wavelength conversion portion and a periphery of the second wavelength conversion portion being in contact with the base body.

16. The light emitting device according to claim 15, wherein
at least the one of the periphery of the first wavelength conversion portion and the periphery of the second wavelength conversion portion has a the cut-away portion where at least the one is distant from the base body.

17. The light emitting device according to claim 1, further comprising a light transmissive resin layer provided on at least a side face of the first wavelength conversion portion, a side face of the light transmitting portion, and a side face of the second wavelength conversion portion.

18. The light emitting device according to claim 1, wherein the light source includes at least one of a light emitting diode element and a laser light emitting element using a group III-V compound semiconductor.

19. The light emitting device according to claim 1, wherein the source light has a peak wavelength of one of an ultraviolet wavelength, violet wavelength and blue wavelength.

20. A method for manufacturing a light emitting device, A light emitting device, including: a light source to emit source light; a first wavelength conversion portion to absorb the source light and to emit first light having a wavelength different from a wavelength of the source light; a light transmitting portion provided at an opposite side of the first wavelength conversion portion from the light source and configured to transmit the source light and the first light; and a second wavelength conversion portion provided at an opposite side of the light transmitting portion from the first wavelength conversion portion and configured to absorb at least one of the source light and the first light to emit second light having a wavelength different from the wavelength of the source light and also different from a wavelength of the first light, part of the source light being configured to be taken to an outside of the light emitting device without passing through at least one of the first wavelength conversion portion and the second wavelength conversion portion, the method comprising:
forming the first wavelength conversion portion;
forming the light transmitting portion, and
forming the second wavelength conversion portion,
at least one of the forming the first wavelength conversion portion and the forming the second wavelength conversion portion includes making a hole in at least one of the first wavelength conversion portion and the second wavelength conversion portion.

* * * * *